(12) United States Patent
Patel et al.

(10) Patent No.: US 11,316,489 B2
(45) Date of Patent: Apr. 26, 2022

(54) BIDIRECTIONAL VARIABLE GAIN AMPLIFICATION

(71) Applicant: Qualcomm Incorporated, San Diego, CA (US)

(72) Inventors: Chirag Dipak Patel, San Diego, CA (US); Xinmin Yu, San Diego, CA (US); Lai Kan Leung, San Marcos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 115 days.

(21) Appl. No.: 16/557,974

(22) Filed: Aug. 30, 2019

(65) Prior Publication Data

US 2021/0067118 A1 Mar. 4, 2021

(51) Int. Cl.
| | |
|---|---|
| H03F 3/45 | (2006.01) |
| H03G 3/30 | (2006.01) |
| H01Q 21/00 | (2006.01) |
| H03F 1/02 | (2006.01) |
| H03F 3/62 | (2006.01) |
| H03K 5/02 | (2006.01) |

(52) U.S. Cl.
CPC ......... *H03G 3/301* (2013.01); *H01Q 21/0025* (2013.01); *H03F 1/0277* (2013.01); *H03F 3/45632* (2013.01); *H03F 3/62* (2013.01); *H03K 5/026* (2013.01)

(58) Field of Classification Search
CPC .. H03G 3/301; H01Q 21/0025; H03F 1/0277; H03F 3/45632; H03F 3/62; H03K 5/026; H04B 1/48
See application file for complete search history.

(56) References Cited

U.S. PATENT DOCUMENTS

| | | | |
|---|---|---|---|
| 4,458,219 A | 7/1984 | Vorhaus | |
| 4,599,585 A | 7/1986 | Vorhaus et al. | |
| 4,635,062 A | 1/1987 | Bierig et al. | |
| 4,713,557 A | 12/1987 | Carter | |
| 5,027,084 A | 6/1991 | Tsukii | |

(Continued)

FOREIGN PATENT DOCUMENTS

| | | |
|---|---|---|
| JP | S54130819 A | 10/1979 |
| WO | 2019113244 A1 | 6/2019 |

OTHER PUBLICATIONS

Ameen H.A., et al., "A 28 GHz Four-Channel Phased-Array Transceiver in 65-nm CMOS Technology for 5G Applications," IEEE 29th International Conference on Microelectronics (ICM), 2017, 4 Pages.

(Continued)

*Primary Examiner* — Khanh V Nguyen
(74) *Attorney, Agent, or Firm* — Colby Nipper/Qualcomm

(57) ABSTRACT

An apparatus is disclosed for bidirectional variable gain amplification. In an example aspect, an apparatus comprises an antenna element of an antenna array and a wireless transceiver. The wireless transceiver comprises a transmit path coupled to the antenna element, a receive path coupled to the antenna element, and a phase shifter disposed in both the transmit path and the receive path. The phase shifter is configured to operate in an active mode and comprises a first bidirectional variable gain amplifier and a second bidirectional variable gain amplifier.

49 Claims, 16 Drawing Sheets

(56) References Cited

U.S. PATENT DOCUMENTS

| | | | |
|---|---|---|---|
| 5,105,166 | A | 4/1992 | Tsukii et al. |
| 5,801,600 | A | 9/1998 | Butland et al. |
| 5,821,813 | A | 10/1998 | Batchelor et al. |
| 6,470,054 | B1 | 10/2002 | Boudry et al. |
| 6,636,085 | B2 | 10/2003 | Okazaki et al. |
| 6,894,657 | B2 | 5/2005 | Carey |
| 7,239,852 | B2 | 7/2007 | Yang et al. |
| 7,256,649 | B2 | 8/2007 | Ksienski et al. |
| 7,312,763 | B2 | 12/2007 | Mohamadi |
| 7,535,409 | B1 | 5/2009 | Choe et al. |
| 7,773,959 | B1 | 8/2010 | Bachhuber et al. |
| 8,208,869 | B2 | 6/2012 | Jeong et al. |
| 8,319,569 | B2 | 11/2012 | Kojima |
| 9,054,792 | B2 | 6/2015 | Wu et al. |
| 9,094,102 | B2 | 7/2015 | Corman et al. |
| 9,362,871 | B2 | 6/2016 | Qureshi |
| 9,473,195 | B2 | 10/2016 | Zhan et al. |
| 9,577,600 | B2 | 2/2017 | Natarajan et al. |
| 9,837,966 | B1 | 12/2017 | Ahmed et al. |
| 9,866,259 | B1* | 1/2018 | Margomenos .......... H04B 1/40 |
| 10,291,282 | B1* | 5/2019 | Lin .......................... H03F 3/193 |
| 10,652,065 | B2* | 5/2020 | Sarkas ................ H04L 27/2614 |
| 10,784,636 | B1 | 9/2020 | Vigilante et al. |
| 10,886,612 | B2 | 1/2021 | Ngai et al. |
| 10,897,298 | B2* | 1/2021 | Kang ................... H04B 7/0617 |
| 2003/0227353 | A1 | 12/2003 | Fayyaz |
| 2004/0121750 | A1 | 6/2004 | Nation |
| 2007/0194991 | A1* | 8/2007 | Mohamadi ........... H01Q 21/062 |
| | | | 343/700 MS |
| 2009/0146764 | A1 | 6/2009 | Chen |
| 2011/0018626 | A1 | 1/2011 | Kojima |
| 2012/0098698 | A1 | 4/2012 | Reuter |
| 2014/0128009 | A1 | 5/2014 | Yeh et al. |
| 2014/0154981 | A1 | 6/2014 | Nakatani |
| 2014/0155003 | A1 | 6/2014 | Nakatani |
| 2014/0287704 | A1 | 9/2014 | Dupuy et al. |
| 2016/0226142 | A1 | 8/2016 | Leroux |
| 2016/0380754 | A1 | 12/2016 | Chen et al. |
| 2017/0338854 | A1 | 11/2017 | Perumana et al. |
| 2018/0019719 | A1 | 1/2018 | Roderick |
| 2018/0309464 | A1 | 10/2018 | Mandegaran |
| 2018/0309502 | A1 | 10/2018 | Khandani |
| 2019/0172635 | A1* | 6/2019 | Ku .......................... H01F 30/12 |
| 2019/0253126 | A1* | 8/2019 | Paramesh ................ H04B 1/16 |
| 2020/0021024 | A1 | 1/2020 | Park et al. |

OTHER PUBLICATIONS

Cetindogan B., et al., "A 6-Bit Vector-Sum Phase Shifter with a Decoder Based Control Circuit for X-Band Phased-Arrays," IEEE Microwave and Wireless Components Letters (vol. 26, Issue: 1, Jan. 2016), Jan. 2016, pp. 64-66.

Cohen E., et al., "A CMOS Bidirectional 32-Element Phased-Array Transceiver at 60 GHz With LTCC Antenna", IEEE Transactions on Microwave Theory and Techniques, Mar. 2013, vol. 61, No. 3, pp. 1359-1375.

El-Khatib., et al., "Fully-Integrated Tunable Linearized CMOS Active Analog Phase Shifter with Active Low Compensation for Multiple Antenna Wireless Transceiver Applications", 2009, IEEE, pp. 2966-2969.

Greene K., et al., "A 60-GHz Dual-Vector Doherty Beamformer", IEEE Journal of Solid-State Circuits, May 2017, vol. 52, No. 5, pp. 1373-1387.

Hu S., et al., "A 28GHz/37GHz/39GHz Multiband Linear Doherty Power Amplifier for 5G Massive MIMO Applications," IEEE International Solid-State Circuits Conference, Feb. 6, 2017, 3 Pages.

Hu S., et al., "A Broadband Mixed-Signal CMOS Power Amplifier with a Hybrid Class-G Doherty Efficiency Enhancement Technique," IEEE Journal of Solid-State Circuits, Mar. 2016, vol. 51, No. 3, pp. 598-613.

International Search Report and Written Opinion—PCT/US2020/048336—ISA/EPO—Mar. 16, 2021.

Kibaroglu K., et al., "An Ultra Low-Cost 32-Element 28 GHz Phased-Array Transceiver with 41 dBm EIRP and 1.0-1.6 Gbps 16-QAM Link at 300 Meters," IEEE Radio Frequency Integrated Circuits Symposium, 2017, pp. 73-76.

Kim S.J., et al., "A New Active Phase Shifter Using a Vector Sum Method," IEEE Microwave and Guided Wave Letters, Jun. 2000, vol. 10, No. 6, pp. 233-235.

Kim S.Y., et al., "An Improved Wideband Al-Pass I/Q Network for Millimeter-Wave Phase Shifters," IEEE Transactions on Microwave Theory and Techniques, vol. 60, No. 11, Nov. 2012, Nov. 2012, pp. 3431-3439.

Sah S.P., et al., "Design and Analysis of a Wideband 15-35-GHz Quadrature Phase Shifter With Inductive Loading," IEEE Transactions on Microwave Theory and Techniques, vol. 61, No. 8, Aug. 2013, Aug. 2013, pp. 3024-3033.

Shahramian S., et al., "A 70-100 GHz Direct-Conversion Transmitter and Receiver Phased Array Chipset Demonstrating 10 Gb/s Wireless Link", IEEE Journal of Solid-state Circuits, May 2013, pp. 1113-1125.

Shahramian S., et al., "A Fully Integrated Scalable W-Band Phased-Array Module with Integrated Antennas, Self-Alignment and Self-Test," IEEE International Solid-State Circuits Conference, Feb. 12, 2018, 3 Pages.

Shimura T., et al., "Low Power Consumption Vector-Sum Phase Shifters using Zero-Pi Amplifiers for Millimeter-Wave Beamforming", Proceedings of the 47th European Microwave Conference, Oct. 10-12, 2017, Nuremberg, Germany, pp. 42-45.

Sowlati T., et al., "A 60GHz 144-Element Phased-Array Transceiver with 51dBm Maximum EIRP and ±60° Beam Steering for Backhaul Application," 2018 IEEE International Solid-State Circuits Conference, ISSCC 2018 / SESSION 4 / mm-WAVE Radios for 5G and Beyond / 4.2, Feb. 12, 2018, 3 Pages.

Valdes-Garcia, et al., "A Fully Integrated 16-Element Phased-Array Transmitter in SiGe BiCMOS for 60-GHz Communications," IEEE Journal of Solid-State Circuits, vol. 45, No. 12, Dec. 2010, pp. 2757-2773.

* cited by examiner

1000

```
┌─────────────────────────────────────────────┐
│ Operate a bidirectional variable gain       │
│ amplifier in an active transmit             │
│ configuration during a first time interval, │
│ the bidirectional variable gain amplifier   │
│ comprising a first port and a third port    │
│                   1002                      │
└─────────────────────────────────────────────┘
                      │
                      ▼
┌─────────────────────────────────────────────┐
│ Amplify a first signal that propagates      │
│ from the first port to the third port in    │
│ the active transmit configuration           │
│                   1004                      │
└─────────────────────────────────────────────┘
                      │
                      ▼
┌─────────────────────────────────────────────┐
│ Operate the bidirectional variable gain     │
│ amplifier in an active receive              │
│ configuration during a second time interval │
│                   1006                      │
└─────────────────────────────────────────────┘
                      │
                      ▼
┌─────────────────────────────────────────────┐
│ Amplify a second signal that propagates     │
│ from the third port to the first port in    │
│ the active receive configuration            │
│                   1008                      │
└─────────────────────────────────────────────┘
```

FIG. 10

BIDIRECTIONAL VARIABLE GAIN AMPLIFICATION

TECHNICAL FIELD

This disclosure relates generally to wireless transceivers and, more specifically, to a bidirectional variable gain amplifier (VGA) that is disposed in both a transmit path and a receive path of a wireless transceiver.

BACKGROUND

Electronic devices use radio-frequency (RF) signals to communicate information. These radio-frequency signals enable users to talk with friends, download information, share pictures, remotely control household devices, receive global positioning information, listen to radio stations, and so forth. Over longer distances, it may be challenging to distinguish the radio-frequency signals from background noise. To address this issue, some electronic devices use an antenna array and multiple phase shifters to perform beamsteering. Beamsteering enables the electronic device to increase transmission signal strength or reception sensitivity in a particular spatial direction. In this way, the electronic device can communicate with other devices over farther distances.

To improve spatial coverage or increase dynamic range, it may be desirable to increase a quantity of antenna elements within one or more antenna arrays of the electronic device. Due to the multiple antenna elements, however, the electronic device's transceiver can become rather large and complex in order to condition and route signals provided to and accepted from each of the antenna elements. Consequently, it can be challenging for some wireless transceiver architectures to support a large quantity of antenna elements and fit within a size constraint of a given electronic device without adversely impacting system performance or increasing cost. Size constraints are especially pertinent for portable electronic devices like smartphones or wearable devices.

SUMMARY

An apparatus is disclosed that implements bidirectional variable gain amplification. The described techniques implement a bidirectional variable gain amplifier, which can be disposed in both a transmit path and a receive path of a wireless transceiver. As such, both the transmit path and the receive path can share a bidirectional variable gain amplifier to conserve space within the wireless transceiver. This enables the wireless transceiver to include a smaller quantity of amplifiers relative to other wireless transceiver designs that utilize separate amplifiers for the transmit path and the receive path. By sharing the bidirectional variable gain amplifier between the transmit path and the receive path, routing lengths and routing complexity can be reduced, which can improve performance by increasing isolation, reducing cross talk, reducing coupling, and so forth.

The bidirectional variable gain amplifier includes multiple ports and a T-network with three branch circuits coupled together at a common node. Each branch circuit includes a set of transistors, which can include one or more common-gate amplifiers. At least two of the branch circuits include switches, which dynamically bias a channel terminal of the set of transistors to propagate signals between different ones of the multiple ports of the bidirectional variable gain amplifier. Using the sets of transistors and the switches, the bidirectional variable gain amplifier can provide isolation, duplexing, amplification (with a gain greater than or less than one), or some combination thereof. In some cases, the bidirectional variable gain amplifier operates in an active transmit configuration or an active receive configuration to improve beamsteering or dynamic range of the wireless transceiver. Alternatively, the bidirectional variable gain amplifier can operate in a passive configuration to conserve power within the wireless transceiver.

A variety of different components within the wireless transceiver can be implemented using one or more bidirectional variable gain amplifiers. In one example, a bidirectional variable gain amplifier implements a stand-alone amplifier within the transmit path and the receive path of the wireless transceiver. If the wireless transceiver includes multiple amplifiers that are coupled to different antenna elements of an antenna array, the multiple amplifiers can jointly equalize gains across the different transmit and receive paths associated with the antenna elements, compensate for performance differences between the individual antenna elements, compensate for differences in routing losses experienced across each of the transmit or receive paths, taper antenna gains across the different antenna elements, and so forth.

In another example, two bidirectional variable gain amplifiers implement a vector modulator of a phase shifter. Because the two bidirectional variable gain amplifiers can be disposed in both the transmit path and the receive path, the vector modulator can be implemented with fewer variable gain amplifiers (e.g., half of the variable gain amplifiers) relative to other vector modulators that use separate variable gain amplifiers for transmission and reception. With the inherent isolation and duplexing properties of the bidirectional variable gain amplifiers that are described herein, the phase shifter can be bidirectional without using switches to route signals from a shared transceiver path to the transmit path or from the receive path to the shared transceiver path. In this manner, the wireless transceiver can realize improved linearity performance and noise figure performance relative to other transceivers that use switches within signal propagation paths. Furthermore, depending on the operational mode of the bidirectional variable gain amplifiers, the phase shifter can operate in an active mode to realize a higher bit resolution, operate in a passive mode to conserve power, or dynamically switch between the active mode and the passive mode to balance both performance and power consumption.

In an example aspect, an apparatus is disclosed for bidirectional phase shifting. The apparatus comprises an antenna element of an antenna array and a wireless transceiver. The wireless transceiver comprises a transmit path coupled to the antenna element, a receive path coupled to the antenna element, and a phase shifter disposed in both the transmit path and the receive path. The phase shifter is configured to operate in an active mode and comprises a first bidirectional variable gain amplifier and a second bidirectional variable gain amplifier.

In an example aspect, an apparatus for bidirectional phase shifting is disclosed. The apparatus comprises an antenna element of an antenna array and a wireless transceiver. The antenna element is configured to transmit a phase-shifted transmit signal and to receive an input receive signal. The wireless transceiver comprises a transmit path coupled to the antenna element, a receive path coupled to the antenna element, and a phase shifter disposed in both the transmit path and the receive path. The phase shifter is configured to operate in an active mode to generate the phase-shifted transmit signal based on an input transmit signal and to generate a phase-shifted receive signal based on the input receive signal. The phase shifter comprises vector modulation means for adjusting amplitudes of two split transmit signals that are associated with the input transmit signal and adjusting amplitudes of two split receive signals that are associated with the input receive signal during the second time interval.

In an example aspect, a method for bidirectional phase shifting is disclosed. The method comprises causing a phase shifter to operate in an active mode during a first time interval and a second time interval. The method also comprises accepting an input transmit signal at a shared node of the phase shifter during the first time interval. The method further comprises generating, using a first bidirectional variable gain amplifier of the phase shifter and a second bidirectional variable gain amplifier of the phase shifter, a phase-shifted transmit signal at a transmit node of the phase shifter during the first time interval. The phase-shifted transmit signal is based on the input transmit signal. During the second time interval, the method comprises accepting an input receive signal at a receive node of the phase shifter. The method also comprises generating, using the first bidirectional variable gain amplifier and the second bidirectional variable gain amplifier, a phase-shifted receive signal at the shared node during the second time interval. The phase-shifted receive signal is based on the input receive signal.

In an example aspect, an apparatus for bidirectional variable gain amplification is disclosed. The apparatus comprises at least one bidirectional variable gain amplifier with two or more ports and a T-network. The two or more ports comprise a first port and a third port. The T-network is coupled between the two or more ports and comprises a common node, a first branch circuit, a second branch circuit, and a third branch circuit. The first branch circuit is coupled between the first port and the common node and comprises a first set of transistors. The second branch circuit is coupled to a supply voltage and the common node and comprises a second set of transistors. The third branch circuit is coupled between the third port and the common node and comprises a third set of transistors.

In an example aspect, a method for bidirectional variable gain amplification is disclosed. The method comprises operating a bidirectional variable gain amplifier in an active transmit configuration during a first time interval. The bidirectional variable gain amplifier comprises a first port and a third port. The method also comprises amplifying a first signal that propagates from the first port to the third port in the active transmit configuration. The method additional comprises operating the bidirectional variable gain amplifier in an active receive configuration during a second time interval. The method further comprises amplifying a second signal that propagates from the third port to the first port in the active receive configuration.

BRIEF DESCRIPTION OF DRAWINGS

FIG. 2-1 illustrates an example wireless transceiver including multiple phase shifters that perform bidirectional variable gain amplification.

FIG. 2-2 illustrates an example wireless transceiver including multiple three-port amplifiers that perform bidirectional variable gain amplification.

FIG. 2-3 illustrates an example wireless transceiver including at least one two-port amplifier that performs bidirectional variable gain amplification.

FIG. 3 illustrates an example phase shifter or an example amplifier that is disposed in both a transmit path and a receive path of a wireless transceiver for bidirectional variable gain amplification.

FIG. 6-1 illustrates an example implementation of a bidirectional variable gain amplifier.

FIG. 6-2 illustrates another example implementation of a bidirectional variable gain amplifier.

FIG. 7-1 illustrates an active transmit configuration of an example three-port bidirectional variable gain amplifier.

FIG. 7-2 illustrates an active receive configuration of an example three-port bidirectional variable gain amplifier.

FIG. 7-3 illustrates a passive configuration of an example three-port bidirectional variable gain amplifier.

FIG. 7-4 illustrates an example two-port bidirectional variable gain amplifier.

FIG. 10 is another flow diagram illustrating an example process for bidirectional variable gain amplification.

DETAILED DESCRIPTION

Figure 1:
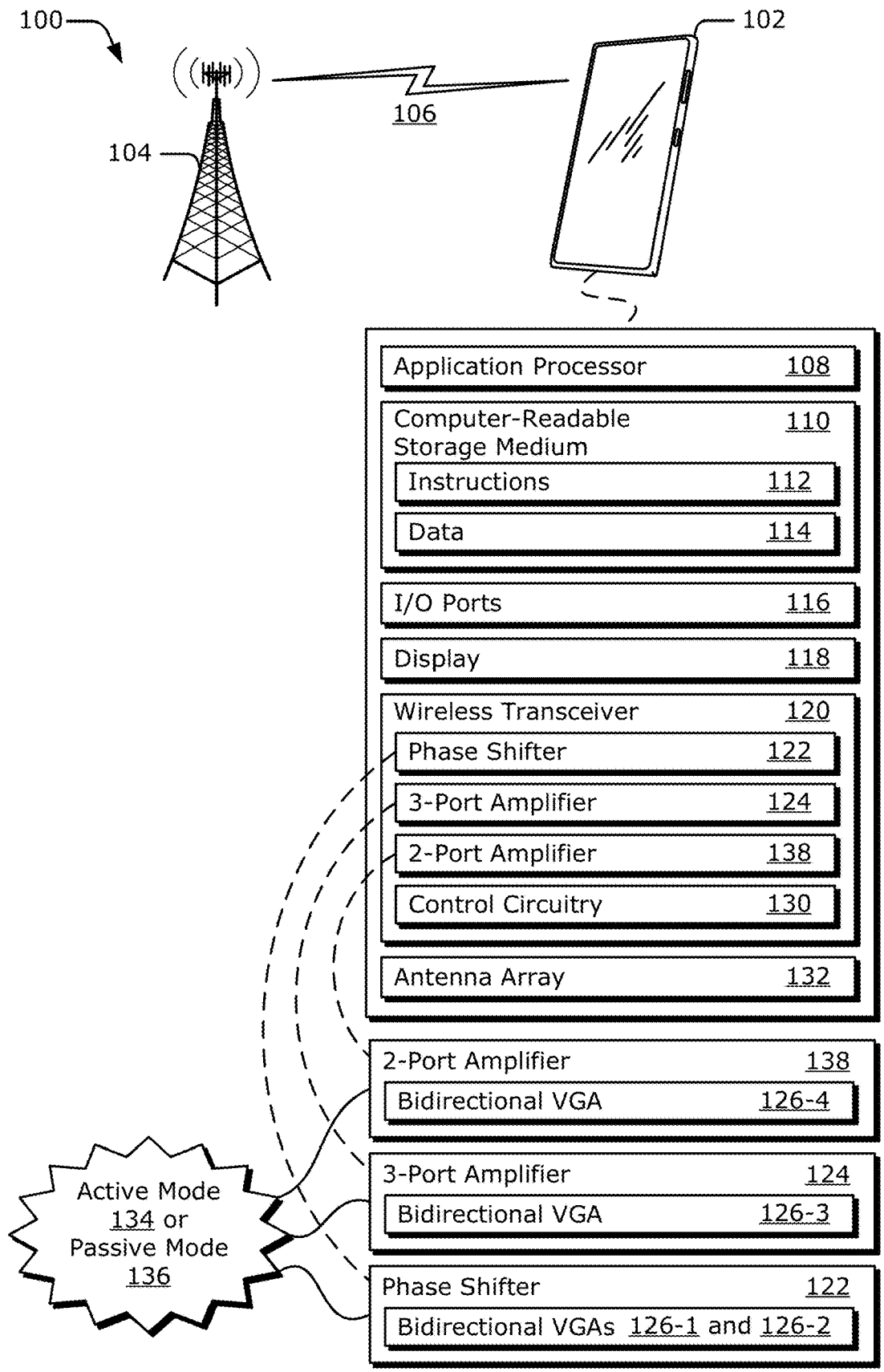
FIG. 1 illustrates an example operating environment for bidirectional variable gain amplification.

It can be challenging to design a wireless transceiver architecture that supports a large quantity of antenna elements associated with one or more antenna arrays and fits within a size constraint of a given electronic device without adversely impacting system performance or increasing cost. This is especially relevant for portable electronic devices like smartphones or wearable devices. To address this challenge, some wireless transceiver designs use passive components, which can be bidirectional. Due to the bidirectionality, the passive components can be shared by both a transmit path and a receive path to conserve space within the wireless transceiver. Some passive components, however, can have limited performance or occupy a larger area relative to their active counterparts. Use of passive component can also increase loss within the wireless transceiver and thereby degrade signal-to-noise performance of the wireless transceiver. Other wireless transceiver designs use switches to enable the transmit and receive paths to reuse components. The switches, however, can add loss, increase routing complexity, degrade linearity performance, and lower isolation between the transmit and receive paths.

In contrast, techniques that implement bidirectional variable gain amplification are described herein. The described techniques implement a bidirectional variable gain amplifier, which can be disposed in both a transmit path and a receive path of a wireless transceiver. As such, both the transmit path and the receive path can share a bidirectional variable gain amplifier to conserve space within the wireless transceiver. This enables the wireless transceiver to include a smaller quantity of amplifiers relative to other wireless transceiver designs that utilize separate amplifiers for the transmit path and the receive path. By sharing the bidirectional variable gain amplifier between the transmit path and the receive path, routing lengths and routing complexity can be reduced, which can improve performance by increasing isolation, reducing cross talk, reducing coupling, and so forth.

The bidirectional variable gain amplifier includes multiple ports and a T-network with three branch circuits coupled together at a common node. Each branch circuit includes a set of transistors, which can include one or more common-gate amplifiers. At least two of the branch circuits include switches, which dynamically bias a channel terminal of the set of transistors to propagate signals between different ones of the multiple ports of the bidirectional variable gain amplifier. Using the sets of transistors and the switches, the bidirectional variable gain amplifier can provide isolation, duplexing, amplification (with a gain greater than or less than one), or some combination thereof. In some cases, the bidirectional variable gain amplifier operates in an active transmit configuration or an active receive configuration to improve beamsteering or dynamic range of the wireless transceiver. Alternatively, the bidirectional variable gain amplifier can operate in a passive configuration to conserve power within the wireless transceiver.

A variety of different components within the wireless transceiver can be implemented using one or more bidirectional variable gain amplifiers. In one example, a bidirectional variable gain amplifier implements a stand-alone amplifier within the transmit path and the receive path of the wireless transceiver. If the wireless transceiver includes multiple amplifiers that are coupled to different antenna elements of an antenna array, the multiple amplifiers can jointly equalize gains across the different transmit and receive paths associated with the antenna elements, compensate for performance differences between the individual antenna elements, compensate for differences in routing losses experienced across each of the transmit or receive paths, taper antenna gains across the different antenna elements, and so forth.

In another example, two bidirectional variable gain amplifiers implement a vector modulator of a phase shifter. Because the two bidirectional variable gain amplifiers can be disposed in both the transmit path and the receive path, the vector modulator can be implemented with fewer variable gain amplifiers (e.g., half of the variable gain amplifiers) relative to other vector modulators that use separate variable gain amplifiers for transmission and reception. With the inherent isolation and duplexing properties of the bidirectional variable gain amplifiers that are described herein, the phase shifter can be bidirectional without routing signals through switches from a shared transceiver path to the transmit path or from the receive path to the shared transceiver path. In this manner, the wireless transceiver can realize improved linearity performance and noise figure performance relative to other transceivers that use switches within signal propagation paths. Furthermore, depending on the operational mode of the bidirectional variable gain amplifiers, the phase shifter can operate in an active mode to realize a higher bit resolution, operate in a passive mode to conserve power, or dynamically switch between the active mode and the passive mode to balance both performance and power consumption.

FIG. 1 illustrates an example operating environment 100 for bidirectional variable gain amplification. In the environment 100, a computing device 102 communicates with a base station 104 through a wireless communication link 106 (wireless link 106). In this example, the computing device 102 is depicted as a smart phone. However, the computing device 102 may be implemented as any suitable computing or electronic device, such as a modem, cellular base station, broadband router, access point, cellular phone, gaming device, navigation device, media device, laptop computer, desktop computer, tablet computer, wearable computer, server, network-attached storage (NAS) device, smart appliance or other internet of things (IoT) device, medical device, sensor or security device, vehicle-based communication system, radio apparatus, and so forth.

The base station 104 communicates with the computing device 102 via the wireless link 106, which may be implemented as any suitable type of wireless link. Although depicted as a tower of a cellular network, the base station 104 may represent or be implemented as another device, such as a satellite, server device, terrestrial television broadcast tower, access point, peer-to-peer device, mesh network node, fiber optic line, and so forth. Therefore, the computing device 102 may communicate with the base station 104 or another device via a wired connection, a wireless connection, or a combination thereof.

The wireless link 106 can include a downlink of data or control information communicated from the base station 104 to the computing device 102, or an uplink of other data or control information communicated from the computing device 102 to the base station 104. The wireless link 106 may be implemented using any suitable communication protocol or standard, such as second-generation (2G), third-generation (3G), fourth-generation (4G), or fifth-generation (5G) cellular; IEEE 802.11 (e.g., Wi-Fi™); IEEE 802.15 (e.g., Bluetooth™); IEEE 802.16 (e.g., WiMAX™); and so forth. In some implementations, the wireless link 106 wirelessly provides power and the base station 104 includes a power source.

As shown, the computing device 102 includes an application processor 108 and a computer-readable storage medium 110 (CRM 110). The application processor 108 can include any type of processor, such as a multi-core processor, that executes processor-executable code stored by the CRM 110. The CRM 110 can include any suitable type of data storage media, such as volatile memory (e.g., random access memory (RAM)), non-volatile memory (e.g., Flash memory), optical media, magnetic media (e.g., disk), and so forth. In the context of this disclosure, the CRM 110 is implemented to store instructions 112, data 114, and other information of the computing device 102, and thus does not include transitory propagating signals or carrier waves.

The computing device 102 may also include input/output ports 116 (I/O ports 116) and a display 118. The I/O ports 116 enable data exchanges or interaction with other devices, networks, or users. The I/O ports 116 may include serial ports (e.g., universal serial bus (USB) ports), parallel ports, audio ports, infrared (IR) ports, user interface ports such as a touchscreen, and so forth. The display 118 presents graphics of the computing device 102, such as a user interface associated with an operating system, program, or application. Alternately or additionally, the display 118 may be implemented as a display port or virtual interface, through which graphical content of the computing device 102 is presented.

A wireless transceiver 120 of the computing device 102 provides connectivity to respective networks and other electronic devices connected therewith. Alternately or additionally, the computing device 102 may include a wired transceiver, such as an Ethernet or fiber optic interface for communicating over a local network, intranet, or the Internet. The wireless transceiver 120 may facilitate communication over any suitable type of wireless network, such as a wireless local area network (LAN) (WLAN), peer-to-peer (P2P) network, mesh network, cellular network, wireless wide-area-network (WWAN), and/or wireless personal-area-network (WPAN). In the context of the example environment 100, the wireless transceiver 120 enables the computing device 102 to communicate with the base station 104 and networks connected therewith. However, the wireless transceiver 120 can also enable the computing device 102 to communicate "directly" with other devices or networks.

The wireless transceiver 120 includes circuitry and logic for transmitting and receiving communication signals via an antenna array 132. Components of the wireless transceiver 120 can include amplifiers, switches, mixers, analog-to-digital converters, filters, and so forth for conditioning the communication signals (e.g., for generating or processing signals). The wireless transceiver 120 may also include logic to perform in-phase/quadrature (I/Q) operations, such as synthesis, encoding, modulation, decoding, demodulation, and so forth. In some cases, components of the wireless transceiver 120 are implemented as separate receiver and transmitter entities. Additionally or alternatively, the wireless transceiver 120 can be realized using multiple or different sections to implement respective receiving and transmitting operations (e.g., separate transmit and receive paths). In general, the wireless transceiver 120 processes data and/or signals associated with communicating data of the computing device 102 using the antenna array 132.

To employ bidirectional variable gain amplification, the wireless transceiver 120 can operate as a time-division duplex wireless transceiver, for example. Thus, the wireless transceiver 120 can generate an uplink signal during one time slot and can process a downlink signal during a different time slot.

Figure 4:
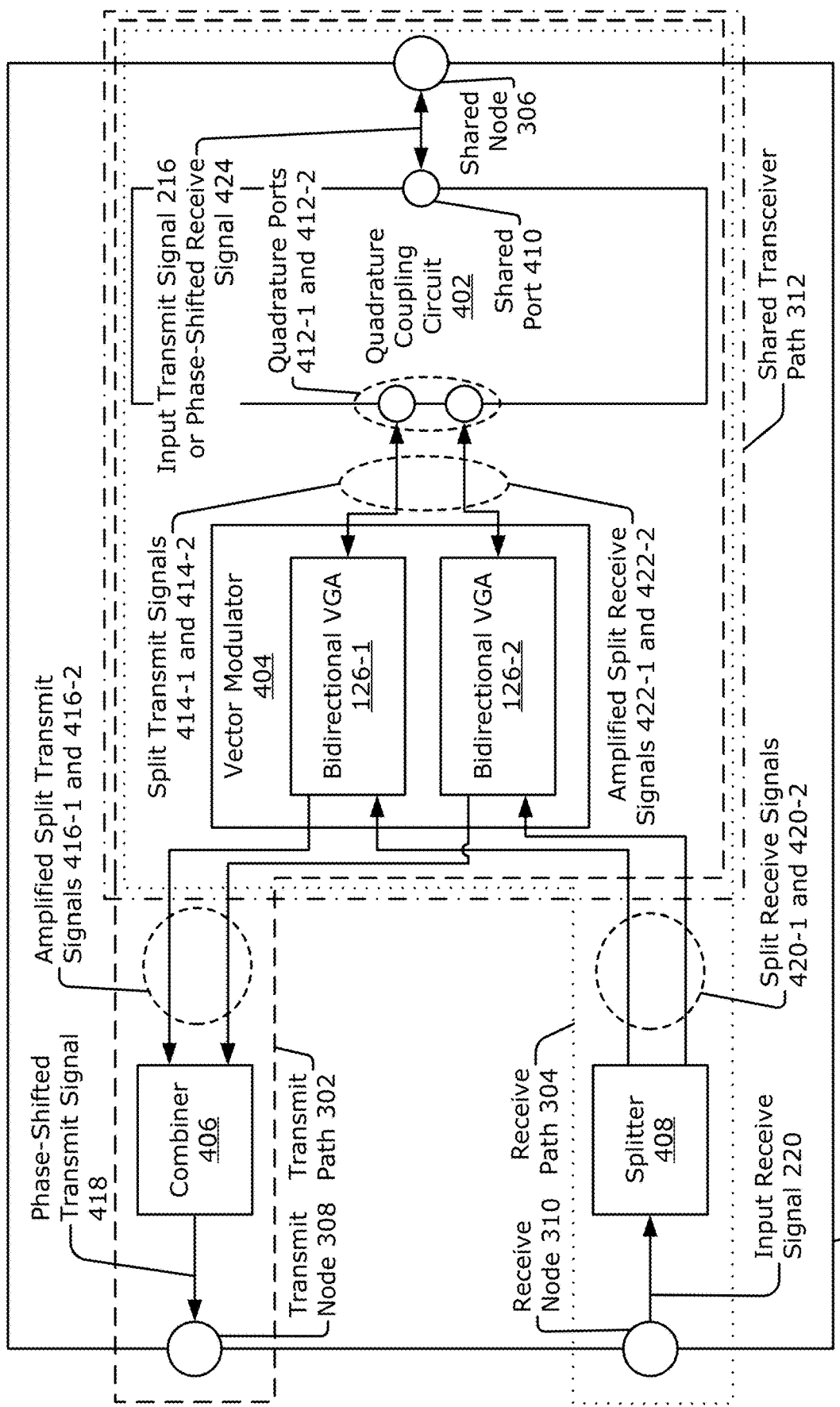
FIG. 4 illustrates an example implementation of a phase shifter for bidirectional variable gain amplification.
Figure 5:
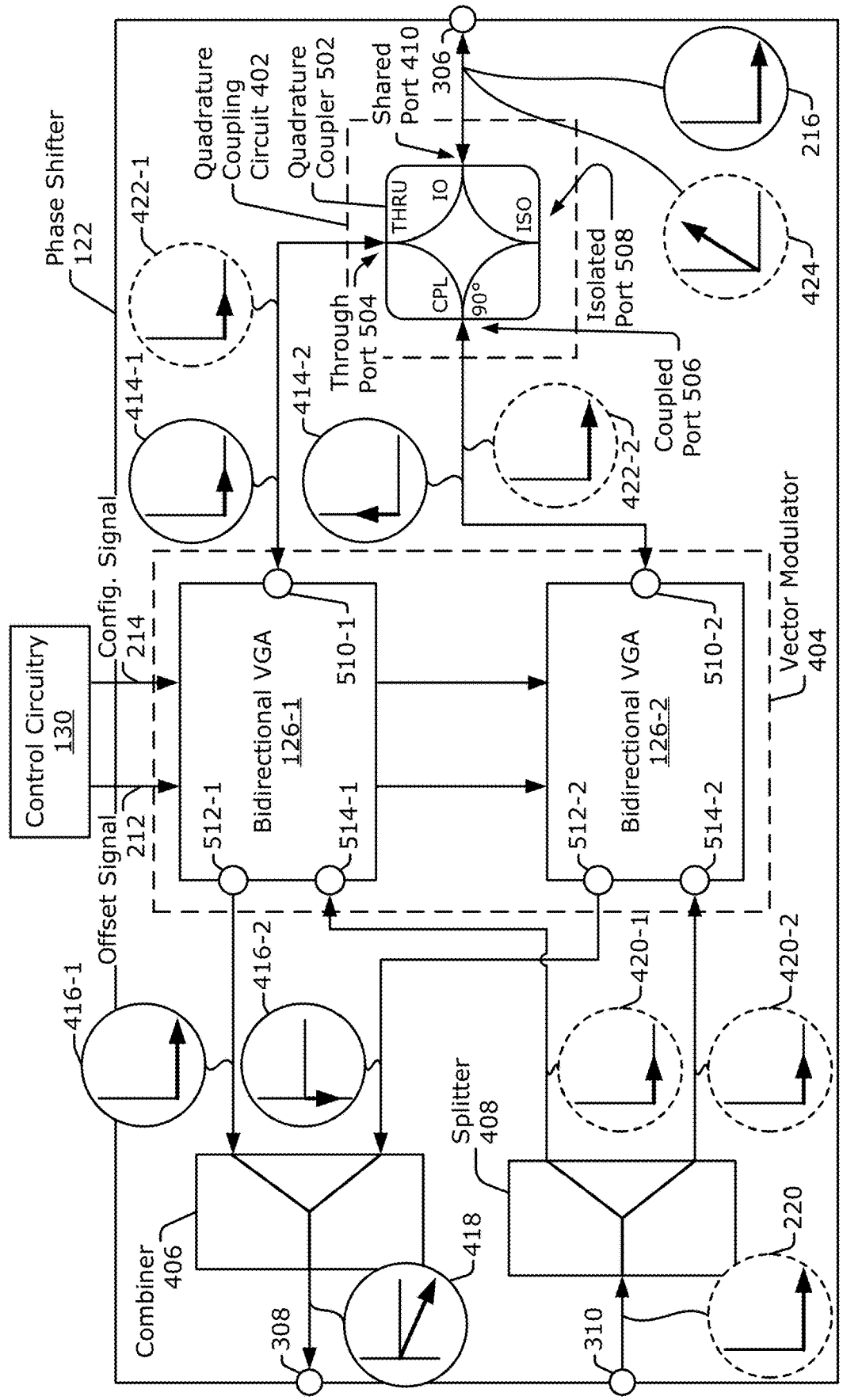
FIG. 5 illustrates example operations of a phase shifter for bidirectional variable gain amplification.
Figures 1, 7:
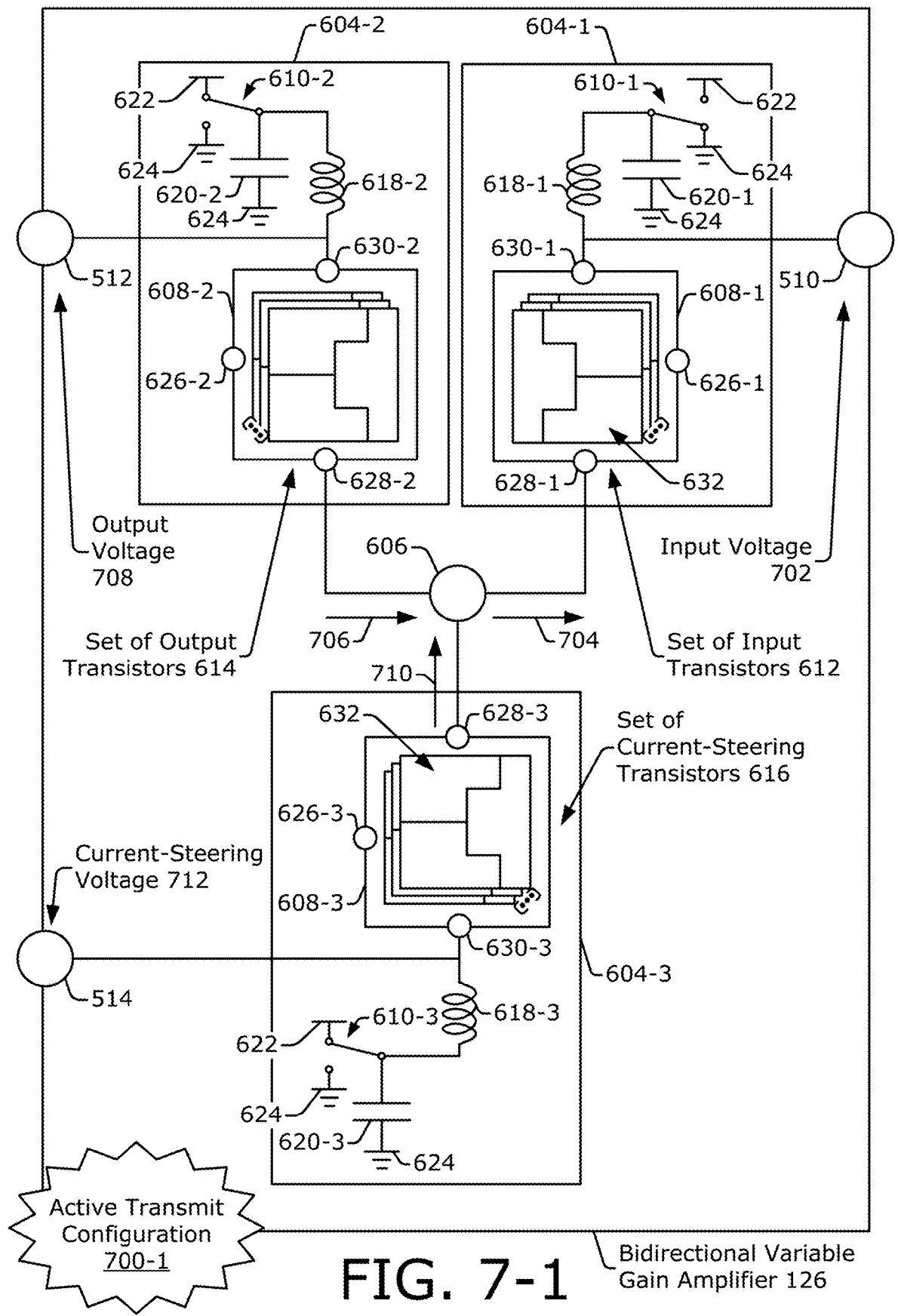
Figures 2, 7:
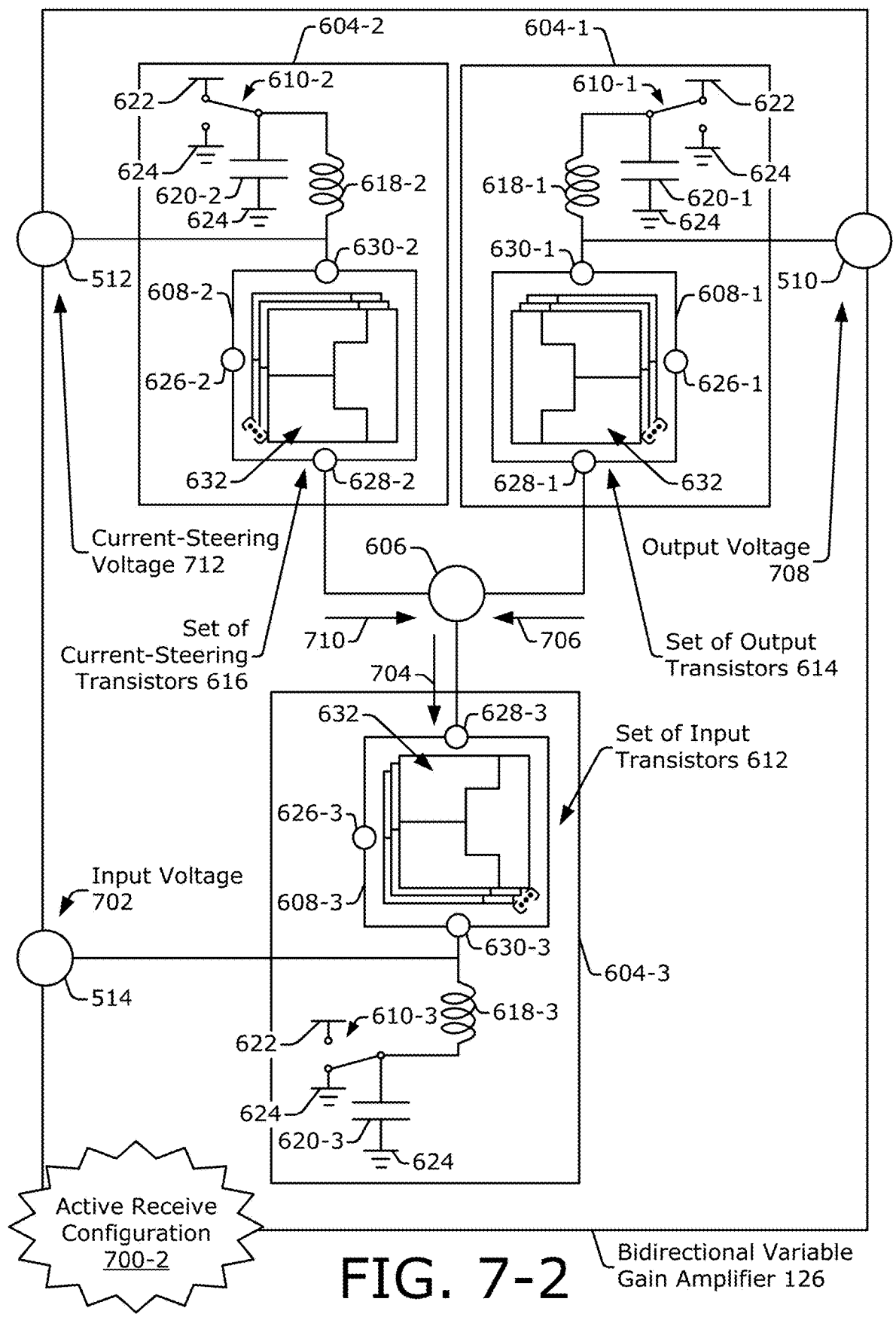
Figures 3, 7:
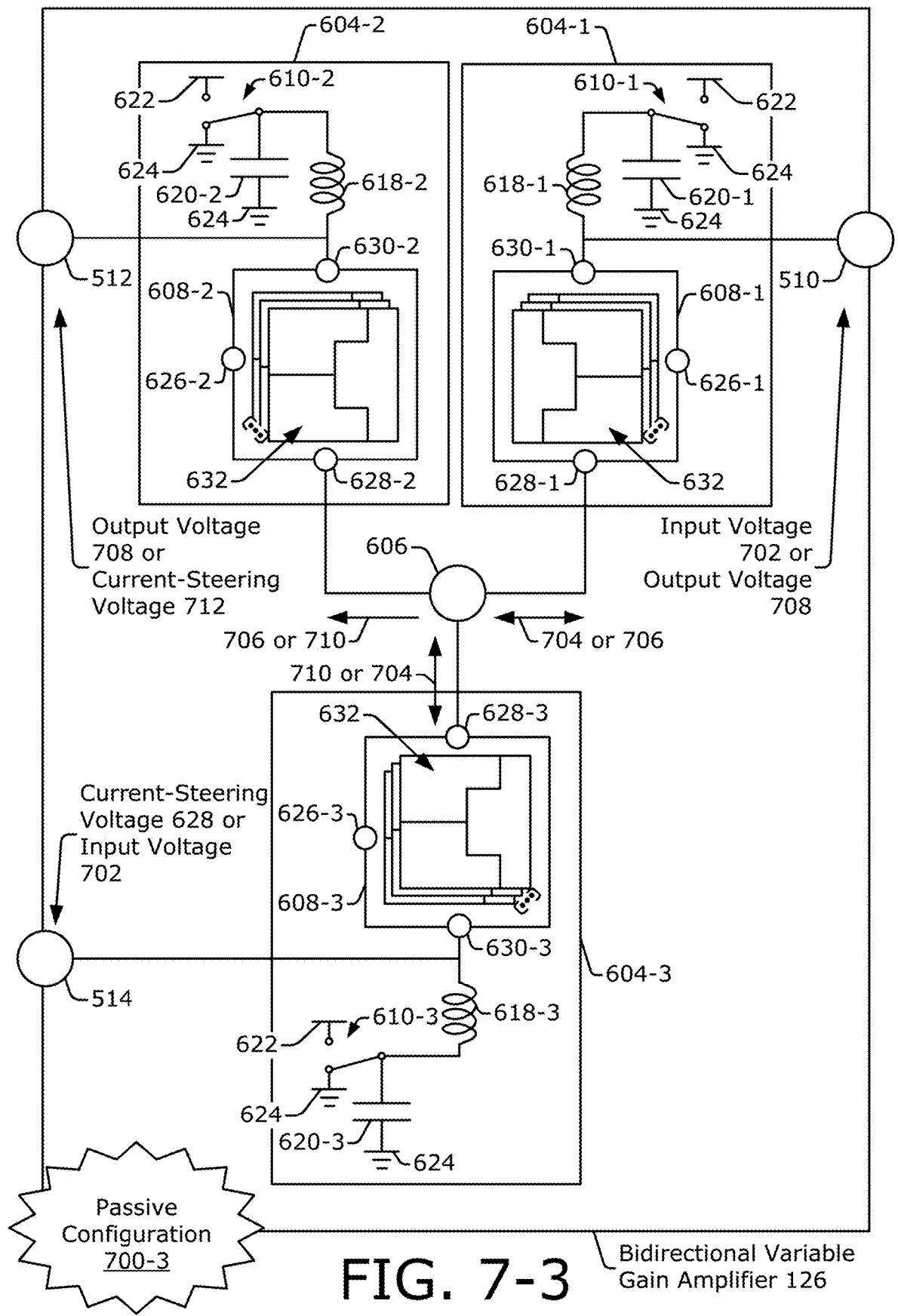
Figures 4, 7:
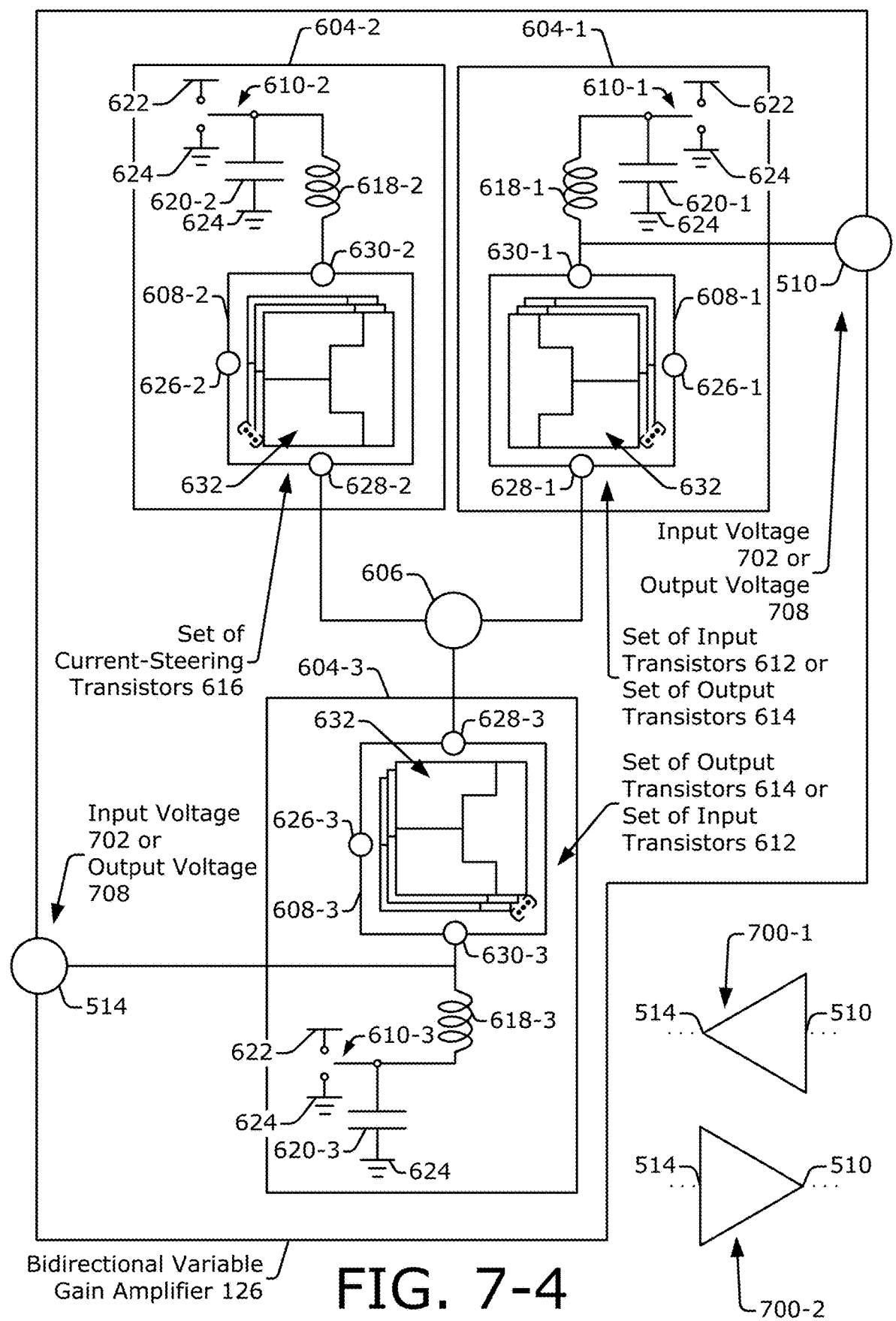

The wireless transceiver 120 includes at least one phase shifter 122, at least one three-port amplifier 124, or at least one two-port amplifier 138. The phase shifter 122 adjusts phases of signals that are transmitted and received via the antenna array 132. Using the phase shifter 122, the wireless transceiver 120 can employ beamsteering techniques to improve dynamic range performance. A vector modulator of the phase shifter 122, which is shown in FIGS. 4 and 5, can be implemented using at least two bidirectional variable gain amplifiers 126-1 and 126-2. In this example, the two bidirectional variable gain amplifiers 126-1 and 126-2 include two three-port bidirectional variable gain amplifiers, examples of which are shown in FIGS. 7-1 to 7-3.

The phase shifter 122 can operate in an active mode 134 or a passive mode 136 based on a configuration of the bidirectional variable gain amplifiers 126-1 and 126-2. Generally, a bit resolution performance of the phase shifter 122 is dependent upon the active mode 134 or the passive mode 136. In the active mode 134, the phase shifter 122 can achieve approximately five bits of resolution or more, for instance. In the passive mode 136, however, the phase shifter 122 can achieve approximately three bits of resolution or less. Although the phase shifter 122 can also operate using fewer than five bits of resolution in the active mode 134, the active mode 134 consumes more power relative to the passive mode 136.

The three-port amplifier 124 and the two-port amplifier 138 adjust amplitudes of signals that are transmitted and received via the antenna array 132. In other words, the three-port amplifier 124 and the two-port amplifier 138 are components that can increase a signal's magnitude (e.g., provide amplification by a factor that is greater than one), decrease the signal's magnitude (e.g., provide attenuation or provide amplification by a factor that is less than one but greater than zero), or pass the signal with no change to the magnitude (e.g., provide buffering or provide amplification by a factor equal to one).

The three-port amplifier 124 can be implemented using at least one bidirectional variable gain amplifier 126-3. In this example, the bidirectional variable gain amplifier 126-3 includes a three-port bidirectional variable gain amplifier, examples of which are shown in FIGS. 7-1 to 7-3. Likewise, the two-port amplifier 138 can be implemented using at least one other bidirectional variable gain amplifier 126-4. An example implementation of the bidirectional variable gain amplifier 126-4 includes a two-port bidirectional variable gain amplifier, which is further described with respect to FIG. 7-4.

Similar to the phase shifter 122, the three-port amplifier 124 and the two-port amplifier 138 can operate in the active mode 134 or the passive mode 136 based on the configuration of the respective bidirectional variable gain amplifiers 126-3 and 126-4. In the active mode 134, the three-port amplifier 124 and the two-port amplifier 138 operate as amplifiers that amplify signals or operate as buffers to pass signals. While operating in the active mode 134, the three-port amplifier 124 and the two-port amplifier 138 have a gain of zero decibels or more. In the passive mode 136, however, the three-port amplifier 124 and the two-port amplifier 138 operate as attenuators and attenuate amplitudes of signals. While operating in the passive mode 136, the three-port amplifier 124 and the two-port amplifier 138 have an effective gain that is less than zero decibels.

Figures 1, 2:
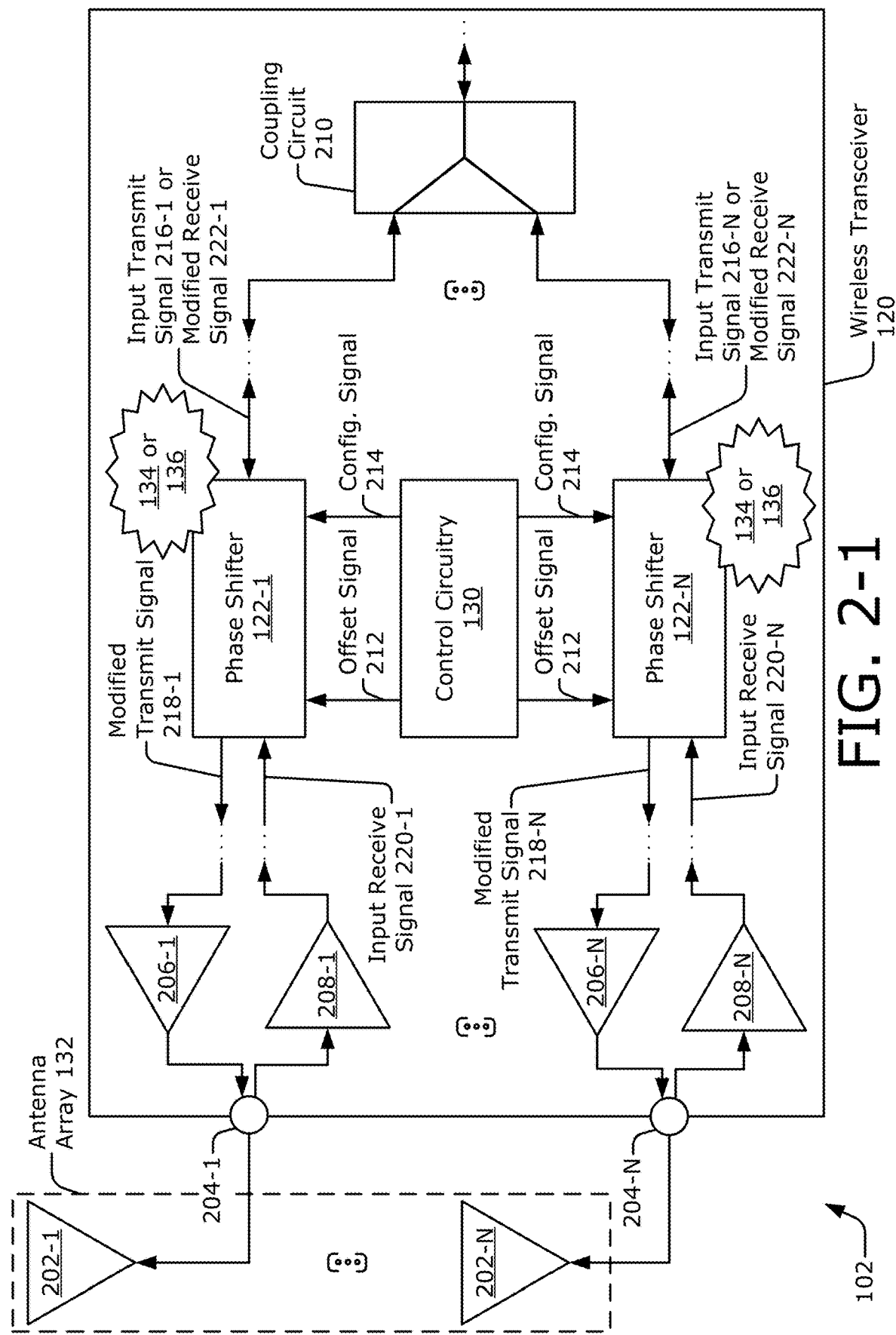
Figure 2:
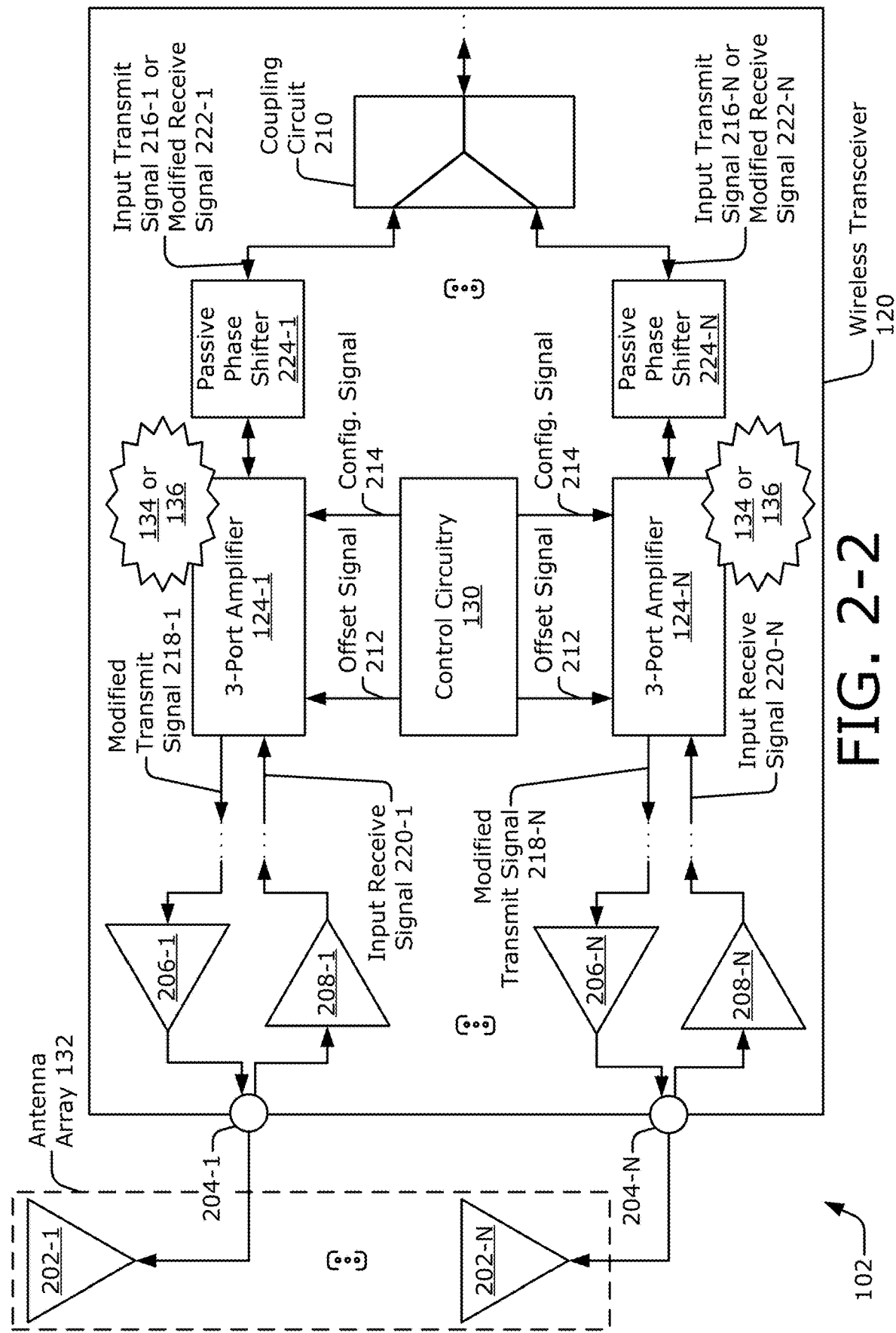
Figures 2, 3:
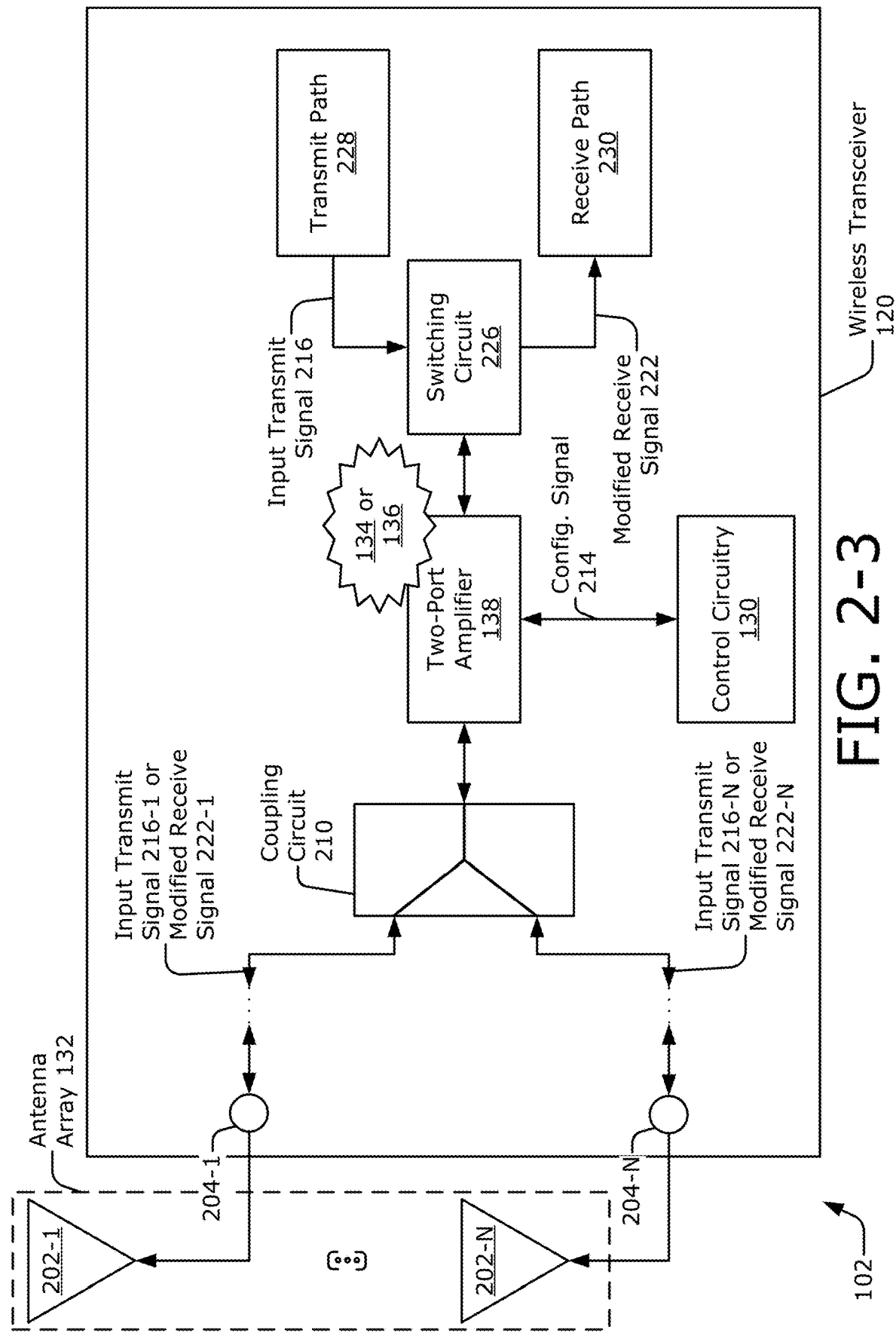
Figure 3:
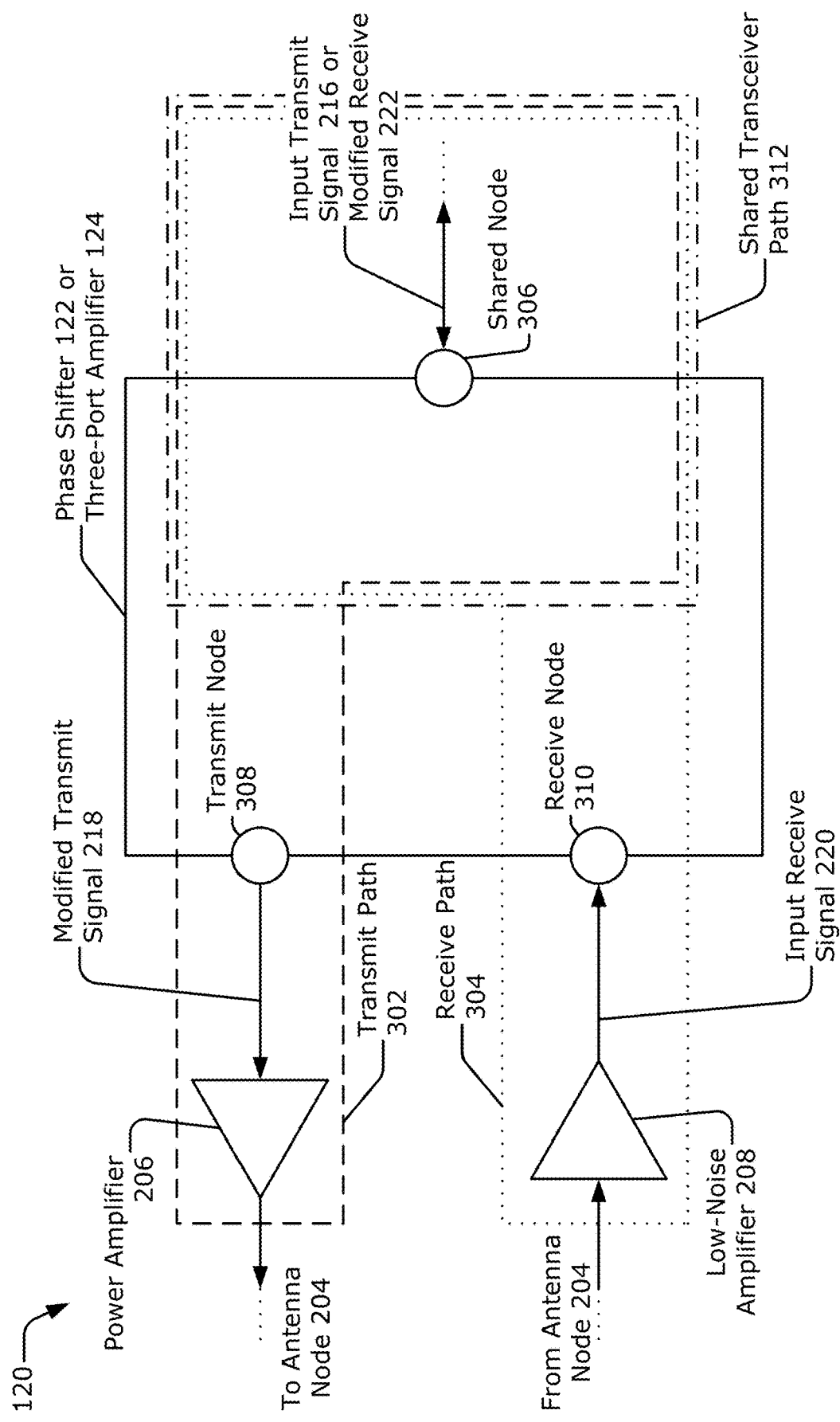

Due to the bidirectional variable gain amplifiers 126-1 to 126-4, the phase shifter 122, the three-port amplifier 124, and the two-port amplifier 138 can be operated bidirectionally and can therefore be disposed in a transmit path and a receive path of the wireless transceiver 120, as further described with respect to FIGS. 2-1 to 3. As such, the wireless transceiver 120 can use the phase shifter 122, the three-port amplifier 124, or the two-port amplifier 138 to condition signals for both transmission and reception. By sharing the phase shifter 122, the three-port amplifier 124, or the two-port amplifier 138 between the transmit path and the receive path, an overall footprint of the wireless transceiver 120 can be smaller relative to other wireless transceivers that include separate phase shifters and/or amplifiers within the transmit path and the receive path.

In example implementations, the bidirectional variable gain amplifiers 126-1 to 126-4 each include a T-network that includes three sets of transistors. Each set of transistors includes at least one transistor. In general, the three sets of transistors respectively operate as a set of input transistors, a set of output transistors, and a set of current-steering transistors. Operations of one or more of the three sets of transistors can vary based on a configuration of the bidirectional variable gain amplifier 126. During a transmit configuration, for instance, a first set of transistors operates as the set of input transistors. During a receive configuration, however, this first set of transistors operates as the set of output transistors. Example implementations of the bidirectional variable gain amplifier 126 are further described with respect to FIGS. 6-1 and 6-2, and example configurations of the bidirectional variable gain amplifier 126 are further described with respect to FIGS. 7-1 to 7-4.

Using the three sets of transistors, the bidirectional variable gain amplifier 126 provides isolation, duplexing, amplification, or some combination thereof. Because the bidirectional variable gain amplifier 126 enables both the active mode 134 and the passive mode 136, the term amplification can represent amplification, attenuation, or buffering, unless context dictates otherwise. The bidirectional variable gain amplifier 126 can support wideband (e.g., broadband) operations and process signals having radio frequencies on the order of gigahertz (GHz), including those within an extremely-high frequency (EHF) spectrum (e.g., for signals having frequencies between approximately 24 and 44 GHz). Generally, the bidirectional variable gain amplifier 126 can at least partially implement bidirectional variable gain amplification as described herein for amplifiers, phase shifters, and other components.

The wireless transceiver 120 also includes control circuitry 130, which can be implemented within or separate from the wireless transceiver 120 as a modem, a general-purpose processor, a controller, fixed logic circuitry, hard-coded logic, some combination thereof, and so forth. Components of the control circuitry 130 can be localized at one module (e.g., an integrated circuit chip) or can be distributed across multiple modules. Although not explicitly shown, the control circuitry 130 can include at least one CRM (e.g., the CRM 110), can include a portion of the CRM 110, or can access the CRM 110 to obtain computer-readable instructions (e.g., instructions 112). The control circuitry 130 at least partially controls the wireless transceiver 120 and enables wireless communication to be performed.

The control circuitry 130 is coupled to the bidirectional variable gain amplifiers 126-1 to 126-4 and controls respective configurations of the bidirectional variable gain amplifiers 126-1 to 126-4. Through the configurations of the bidirectional variable gain amplifiers 126-1 to 126-4, the control circuitry 130 controls the operational modes of the phase shifter 122, the three-port amplifier 124, and the two-port amplifier 138. In some cases, the control circuitry 130 causes the phase shifter 122, the three-port amplifier 124, and/or the two-port amplifier 138 to dynamically switch between the active mode 134 and the passive mode 136 based on a current operational mode of the wireless transceiver 120. Different types of operational modes may include a transmission mode, a reception mode, different spatial coverage modes, different frequency modes (e.g., a high-frequency mode or a low-frequency mode), different power modes (e.g., a low-power mode or a high-power mode), different resource control states (e.g., a connected mode, an inactive mode, or an idle mode), different modulation modes (e.g., lower-order modulation modes such as quadrature phase-shift keying (QPSK) modes or higher-order modulation modes such as 64 quadrature amplitude modulation (QAM) or 256 QAM), and so forth.

In some cases, the control circuitry 130 specifies relative phase offsets between multiple phase shifters 122 that are respectively associated with different antenna elements of the antenna array 132. By controlling the relative phase offsets, the control circuitry 130 can use beamsteering techniques to increase transmission power or increase reception sensitivity along a particular direction. In other cases, the control circuitry 130 specifies relative amplitude offsets between multiple three-port amplifiers 124 that are coupled to the multiple antenna elements. By controlling the relative amplitude offsets, the control circuitry 130 can equalize gains across the different transmit and receive paths associated with the antenna elements, compensate for performance differences between the individual antenna elements, compensate for differences in routing losses experienced across each of the transmit or receive paths, taper antenna gains across the different antenna elements, and so forth.

FIG. 2-1 illustrates an example wireless transceiver 120 including multiple phase shifters 122-1 to 122-N that perform bidirectional variable gain amplification, with N representing a positive integer. In the depicted configuration, the antenna array 132 includes multiple antenna elements 202-1 to 202-N. A quantity of the antenna elements 202-1 to 202-N is shown to equal a quantity of the phase shifters 122-1 to 122-N. In other implementations, these quantities may differ. The antenna elements 202-1 to 202-N are respectively coupled to antenna nodes 204-1 to 204-N of the wireless transceiver 120. Together, the antenna array 132 and the wireless transceiver 120 transmit uplink signals and receive downlink signals during different time slots.

The wireless transceiver includes multiple transmit paths with multiple power amplifiers 206-1 to 206-N respectively coupled to the antenna nodes 204-1 to 204-N. The wireless transceiver 120 also includes multiple receive paths with multiple low-noise amplifiers 208-1 to 208-N respectively coupled to the antenna nodes 204-1 to 204-N. The phase shifters 122-1 to 122-N are respectively coupled (e.g., indirectly coupled or directly coupled) to the power amplifiers 206-1 to 206-N and the low-noise amplifiers 208-1 to 208-N.

The wireless transceiver 120 also includes a coupling circuit 210, which is coupled to the phase shifters 122-1 to 122-N. The coupling circuit 210 operates as a splitter or a combiner based on the operational mode of the wireless transceiver 120. The coupling circuit 210 can be coupled to other components within the wireless transceiver 120 that are not shown in FIG. 2, such as mixers, filters, other amplifiers, analog-to-digital converters, digital-to-analog converters, and so forth. In some cases, the coupling circuit 210 comprises a single stage that combines N signals together into a single signal or splits a single signal into N signals. In other cases, the coupling circuit 210 comprises multiple stages that incrementally combine N signals together to produce a single signal or incrementally split a single signal into N signals.

The control circuitry 130 is coupled to the phase shifters 122-1 to 122-N, and generates an offset signal 212 and a configuration signal 214. The offset signal 212 or the configuration signal 214 can comprise multiple signals that are sent to respective phase shifters 122-1 to 122-N. Alternatively, the offset signal 212 or the configuration signal 214 can comprise a multi-bit signal with each bit or group of bits respectively controlling the respective phase shifters 122-1 to 122-N.

Using the offset signal 212, the control circuitry 130 controls, for example, relative phase offsets that are applied across the phase shifters 122-1 to 122-N. The control circuitry 130 can determine the relative phase offsets based on a target direction that is selected for increasing transmission power or sensitivity. In some cases, the target direction is based on a known direction to the base station 104 of FIG. 1.

Using the configuration signal 214, the control circuitry 130 causes the phase shifters 122-1 to 122-N to operate in the active mode 134 or the passive mode 136. The control circuitry 130 can determine a mode at a particular time based on a quantity of antenna elements 202-1 to 202-N, which may vary across different types of computing devices 102. The control circuitry 130 can also determine the mode based on available power, based on a target dynamic range performance, which can vary based on a selected carrier frequency or based on a current distance between the computing device 102 and the base station 104, and so forth. In general, the active mode 134 improves performance of the wireless transceiver 120 and utilizes a larger amount of power relative to the passive mode 136.

During a transmit operation, the wireless transceiver 120 generates an input signal (not shown), which the coupling circuit 210 splits into multiple input transmit signals 216-1 to 216-N. The multiple input transmit signals 216-1 to 216-N can have similar amplitudes and similar phases. The phase shifters 122-1 to 122-N respectively generate modified transmit signals 218-1 to 218-N based on the input transmit signals 216-1 to 216-N. The modified transmit signals 218-1 to 218-N can have different phases or different amplitudes relative to the input transmit signals 216-1 to 216-N. The power amplifiers 206-1 to 206-N amplify the modified transmit signals 218-1 to 218-N for transmission via the antenna elements 202-1 to 202-N. The transmitted signals can represent an uplink signal.

During a receive operation, the antenna array 132 can receive a downlink signal (not shown). The low-noise amplifiers 208-1 to 208-N generate input receive signals 220-1 to 220-N based on the downlink signal. Relative phases of the input receive signals 220-1 to 220-N can differ due to differences in locations of the antenna elements 202-1 and 202-N and an angle of arrival of the downlink signal. Likewise, relative amplitudes of the input receive signals 220-1 to 220-N can also differ due to differences in locations of the antenna elements 202-1 and 202-N, due to differences in routing lengths between the antenna elements 202-1 to 202-N and the antenna nodes 204-1 to 204-N, or due to performance differences of the antenna elements 202-1 to 202-N.

The phase shifters 122-1 to 122-N generate modified receive signals 222-1 to 222-N based on the input receive signals 220-1 to 220-N. For example, the phase shifters 122-1 to 122-N can compensate for the relative phase differences between the input receive signals 220-1 to 220-N by causing the modified receive signals 222-1 to 222-N to have substantially similar phases. In other words, the modified receive signals 222-1 to 222-N generally have smaller relative phase offsets compared to relative phase offsets between the input receive signals 220-1 to 220-N. In this way, the modified receive signals 222-1 to 222-N can be constructively combined via the coupling circuit 210 to increase sensitivity. With these phase-shifting adjustments, the computing device 102 can communicate with other devices at farther distances.

FIG. 2-2 illustrates an example wireless transceiver 120 including multiple three-port amplifiers 124-1 to 124-N that perform bidirectional variable gain amplification. The wireless transceiver 120 of FIG. 2-2 is similar to the wireless transceiver 120 of FIG. 2-1, except the wireless transceiver 120 of FIG. 2-2 includes the three-port amplifiers 124-1 to 124-N and passive phase shifters 224-1 to 224-N instead of the phase shifters 122-1 to 122-N. A quantity of the antenna elements 202-1 to 202-N is shown to equal a quantity of the three-port amplifiers 124-1 to 124-N. In other implementations, these quantities may differ.

The three-port amplifiers 124-1 to 124-N are respectively coupled (e.g., indirectly coupled or directly coupled) to the power amplifiers 206-1 to 206-N and the low-noise amplifiers 208-1 to 208-N. The passive phase shifters 224-1 to 224-N are coupled between respective three-port amplifiers 124-1 to 124-N and the coupling circuit 210.

The control circuitry 130 is coupled to the three-port amplifiers 124-1 to 124-N, and generates the offset signal 212 and the configuration signal 214. The offset signal 212 or the configuration signal 214 can comprise multiple signals that are sent to respective three-port amplifiers 124-1 to 124-N. Alternatively, the offset signal 212 or the configuration signal 214 can comprise a multi-bit signal with each bit or group of bits respectively controlling the respective three-port amplifiers 124-1 to 124-N. Using the offset signal 212, the control circuitry 130 controls, for example, relative amplitude offsets that are applied across the amplifiers 124-1 to 124-N. The control circuitry 130 can determine the relative amplitude offsets based on a look-up table or based on a chosen radiation pattern of the antenna array 132.

Using the configuration signal 214, the control circuitry 130 causes the three-port amplifiers 124-1 to 124-N to operate in the active mode 134 or the passive mode 136. The control circuitry 130 can determine a mode at a particular time based on a quantity of antenna elements 202-1 to 202-N, which may vary across different types of computing devices 102. The control circuitry 130 can also determine the mode based on available power, based on a target dynamic range performance, which can vary based on a selected carrier frequency or based on a current distance between the computing device 102 and the base station 104, and so forth. In general, the active mode 134 improves performance of the wireless transceiver 120 and utilizes a larger amount of power relative to the passive mode 136.

In some implementations, the three-port amplifiers 124-1 to 124-N operate in the passive mode 136. As such, the three-port amplifiers 124-1 to 124-N behave as switches that enable the power amplifiers 206-1 to 206-N and the low-noise amplifiers 208-1 to 208-N to be respectively coupled to the passive phase shifters 224-1 to 224-N and isolated from one another. By using the three-port amplifiers 124-1 to 124-N instead of switches to provide this duplexing capability, the wireless transceiver 120 can experience less loss relative to implementations that use switches.

In other implementations, the three-port amplifiers 124-1 to 124-N operate in the active mode 134, as further described below. By operating in the active mode 134, the three-port amplifiers 124-1 to 124-N can compensate for at least a portion of the losses resulting from the passive phase shifters 224-1 to 224-N. In some cases, the three-port amplifiers 124-1 to 124-N are implemented as part of a beginning (e.g., driver) stage of the power amplifiers 206-1 to 206-N and an end stage of the low-noise amplifiers 208-1 to 208-N.

During a transmit operation, the three-port amplifiers 124-1 to 124-N respectively generate modified transmit signals 218-1 to 218-N based on the input transmit signals 216-1 to 216-N. The modified transmit signals 218-1 to 218-N can have different amplitudes relative to the input transmit signals 216-1 to 216-N.

During a receive operation, relative amplitudes of the input receive signals 220-1 to 220-N can differ due to differences in locations of the antenna elements 202-1 and 202-N, due to differences in routing lengths between the antenna elements 202-1 to 202-N and the antenna nodes 204-1 to 204-N, or due to performance differences of the antenna elements 202-1 to 202-N. The three-port amplifiers 124-1 to 124-N generate modified receive signals 222-1 to 222-N based on the input receive signals 220-1 to 220-N. For example, the three-port amplifiers 124-1 to 124-N can compensate for the relative amplitude differences between the input receive signals 220-1 to 220-N by adjusting amplitudes of the modified receive signals 222-1 to 222-N. In some cases, the modified receive signals 222-1 to 222-N can have smaller relative amplitude offsets compared to relative amplitude offsets between the input receive signals 220-1 to 220-N. By tailoring amplitudes of the modified receive signals 222-1 to 222-N, the amplifiers 124-1 to 124-N can also increase sensitivity of the wireless transceiver 120. With these phase-shifting or amplitude adjustments, the computing device 102 can communicate with other devices at farther distances.

FIG. 2-3 illustrates an example wireless transceiver 120 including at least one two-port amplifier 138 that performs bidirectional variable gain amplification. The two-port amplifier 138 is coupled to the coupling circuit 210 of FIG. 2-1 or 2-2. In other words, components between the antenna nodes 204-1 to 204-N and the coupling circuit 210 can include the phase shifters 122-1 to 122-N of FIG. 2-1 or the three-port amplifiers 124-1 to 124-N of FIG. 2-2.

In the depicted configuration, the wireless transceiver 120 includes at least one switching circuit 226, at least one transmit path 228, and at least one receive path 230. The switching circuit 226 is coupled to the two-port amplifier 138, the transmit path 228, and the receive path 230. Example implementations of the switching circuit 226 include at least one switch or at least one multiplexer. The switching circuit 226 selectively connects the transmit path 228 or the receive path 230 to the two-port amplifier 138.

The transmit path 228 can include at least one upconversion mixer, at least one filter, or at least one digital-to-analog converter. The receive path 230 can similarly include at least one downconversion mixer, at least one filter, or at least one analog-to-digital converter. In general, the transmit path 228 and the receive path 230 include components that are designed for or unique to that particular path. In some cases, one or more of these components are not bidirectional.

The control circuitry 130 is coupled to the two-port amplifier 138, and generates the configuration signal 214. Using the configuration signal 214, the control circuitry 130 causes the two-port amplifier 138 to operate in the active mode 134 or the passive mode 136. The control circuitry 130 can determine the mode based on available power, for instance.

During a transmit operation, the transmit path 228 generates the input transmit signal 216. The switching circuit 226 connects the transmit path 228 to an input port of the two-port amplifier 138. Depending on the configuration signal 214, the two-port amplifier 138 amplifies, passes, or attenuates the input transmit signal 216. The coupling circuit 210 splits the input transmit signal 216 into the input transmit signals 216-1 to 216-N.

During a receive operation, the coupling circuit 210 combines the modified receive signals 222-1 to 222-N to generate the modified receive signal 222. The two-port amplifier 138 amplifies, passes, or attenuates the modified receive signal 222. The switching circuit 226 connects an output port of the two-port amplifier 138 to the receive path 230 and passes the modified receive signal 222 to the receive path 230.

Although not shown, other implementations of the wireless transceiver 120 can include multiple two-port amplifiers 138-1 to 138-N coupled in series with the phase shifters 122-1 to 122-N. In general, the two-port amplifier 138 can be implemented as part of the transmit path 228 (not shown), as part of the receive path 230 (not shown), or as part of both the transmit path 228 and the receive path 230 (e.g., within a shared transceiver path) (shown in FIG. 2-3). Within the transmit path 228, the two-port amplifier 138 conditions a signal for transmission. Likewise within the receive path 230, the two-port amplifier 138 conditions a signal for reception. Within the shared transceiver path, however, the two-port amplifier 138 conditions signals for both transmission and reception (e.g., conditions both the input transmit signal 216 and the modified receive signal 222). A relationship between a transmit path, a receive path, and a shared transceiver path is further described below with respect to FIG. 3.

FIG. 3 illustrates an example phase shifter 122 or an example three-port amplifier 124 that is disposed in both a transmit path 302 and a receive path 304 of a wireless transceiver 120 for bidirectional variable gain amplification. In the depicted configuration, the phase shifter 122 or the three-port amplifier 124 represents one of the phase shifters 122-1 to 122-N or three-port amplifiers 124-1 to 124-N shown in FIG. 2. The transmit path 302 and the receive path 304 respectively include a power amplifier 206 (e.g., one of the power amplifiers 206-1 to 206-N of FIG. 2) and a low-noise amplifier 208 (e.g., one of the low-noise amplifiers 208-1 to 208-N of FIG. 2). Both the power amplifier 206 and the low-noise amplifier 208 are coupled to one of the antenna nodes 204-1 to 204-N(of FIG. 2). Although not shown, the transmit path 302 and the receive path 304 can also include the transmit path 228 and the receive path 230 of FIG. 2-3, respectively.

The phase shifter 122 or the three-port amplifier 124 is shown to be disposed in both the transmit path 302 and the receive path 304. In other words, the phase shifter 122 or the three-port amplifier 124 is electrically coupled to other components within the transmit path 302 and the receive path 304, such as the power amplifier 206 and the low-noise amplifier 208. In this way, signals that propagate through the transmit path 302 propagate through the phase shifter 122 or the three-port amplifier 124. Additionally, signals that propagate through the receive path 304 also propagate through the phase shifter 122 or the three-port amplifier 124.

The phase shifter 122 or the three-port amplifier 124 includes a shared node 306 disposed in both the transmit path 302 and the receive path 304, a transmit node 308 disposed in the transmit path 302, and a receive node 310 disposed in the receive path 304. Although not shown, the shared node 306 may be coupled to other components within the transmit path 302 and/or the receive path 304, such as a mixer or the coupling circuit 210 (of FIG. 2).

Within at least a portion of the phase shifter 122 or the three-port amplifier 124, the transmit path 302 and the receive path 304 share common components along a shared transceiver path 312. This is illustrated with a portion of the dashed lines of the transmit path 302 and a portion of the dotted lines of the receive path 304 being contained within the dotted-dashed lines of the shared transceiver path 312. In this manner, the shared transceiver path 312 represents a common path that is shared by both the transmit path 302 and the receive path 304 (e.g., the shared transceiver path 312 includes at least a portion of both the transmit path 302 and the receive path 304).

Although not shown, the two-port amplifier 138 of FIG. 2-3 can be implemented as part of the shared transceiver path 312. The bidirectional variable gain amplifiers 126-1 and 126-2 of the phase shifter 122, the bidirectional variable gain amplifier 126-3 of the three-port amplifier 124, and the bidirectional variable gain amplifier 126-4 of the two-port amplifier 138 (e.g., of FIGS. 1 and/or 3) are example components that are disposed in the shared transceiver path 312.

FIG. 4 illustrates an example implementation of a phase shifter 122 for bidirectional variable gain amplification. In the depicted configuration, the phase shifter 122 includes a quadrature coupling circuit 402, a vector modulator 404, a combiner 406, and a splitter 408. The vector modulator 404 includes the bidirectional variable gain amplifiers 126-1 and 126-2 of FIG. 1. Using the bidirectional variable gain amplifiers 126-1 and 126-2, the phase shifter 122 can occupy less space compared to other phase shifter designs that use separate variable gain amplifiers for transmission and reception.

The phase shifter 122 includes components that are disposed along the transmit path 302, components that are disposed along the receive path 304, and components that are disposed along the shared transceiver path 312 (e.g., components that are shared by both the transmit path 302 and the receive path 304). In particular, the transmit path 302 includes the combiner 406, and the receive path 304 includes the splitter 408. The vector modulator 404 provides an interface that merges the transmit path 302 and the receive path 304 into the shared transceiver path 312 and also splits the transmit path 302 and the receive path 304 from the shared transceiver path 312. The shared transceiver path 312 includes the vector modulator 404 and the quadrature coupling circuit 402, both of which can be bidirectional components.

The quadrature coupling circuit 402 includes a shared port 410, which is coupled to the shared node 306, and two quadrature ports 412-1 and 412-2. In some implementations, the quadrature coupling circuit 402 is implemented using passive components, such as a quadrature coupler (e.g., a three-decibel (3 dB) ninety-degree hybrid coupler). Generally, the quadrature coupling circuit 402 provides an approximately ninety-degree phase delta between the quadrature ports 412-1 and 412-2. During transmission, the quadrature coupling circuit 402 respectively generates quadrature signals at the quadrature ports 412-1 and 412-2 based on an input signal that is accepted at the shared port 410. Due to the ninety-degree phase delta, phases of the quadrature signals differ by approximately ninety degrees. During reception, the quadrature coupling circuit 402 generates an output signal at the shared port 410 based on in-phase signals respectively accepted at the quadrature ports 412-1 and 412-2. Due to the ninety-degree phase delta, the output signal has a phase that represents a summation of a phase of one of the in-phase signals and a phase of another of the in-phase signals that is shifted by ninety degrees.

The combiner 406 and the splitter 408 are respectively coupled to the transmit node 308 and the receive node 310. In contrast to the quadrature coupling circuit 402, the combiner 406 and the splitter 408 substantially maintain a relative phase offset between signals that are accepted or generated, respectively. In other words, the combiner 406 combines multiple signals without substantially shifting phases of the multiple signals relative to each other at the combined output, and the splitter 408 generates multiple signals that are approximately in-phase with respect to each other.

Types of components that can implement the combiner 406 or the splitter 408 include a Wilkinson circuit (e.g., a Wilkinson combiner or splitter), a T-junction, a transformer, a current summing node, a matching network, and so forth. In an example implementation of the combiner 406 using a current summing node, outputs of the vector modulator 404 that are coupled to the combiner 406 may be current mode outputs from transistors within the vector modulator 404, and the combiner 406 provides the load impedance to each output of the vector modulator 404. In an example implementation of the splitter 408 using a matching network, inputs to the vector modulator 404 coming from the splitter 408 may have an impedance Z1, and the splitter 408 provides impedance transformation from Z1 to Z2*2. In this manner, the two amplifiers within the vector modulator 404 provide a combined impedance Z2 through the splitter 408 to the receive node 310. The impedance Z2 can be matched to the output impedance of the low-noise amplifier 208 that is coupled to receive node 310.

The vector modulator 404 is coupled between the quadrature coupling circuit 402, the combiner 406, and the splitter 408. The vector modulator 404 adjusts amplitudes of signals that are provided by the quadrature coupling circuit 402 for transmission operations or by the splitter 408 for reception operations. The vector modulator 404 includes the two bidirectional variable gain amplifiers 126-1 and 126-2, which are both disposed in the transmit path 302 and the receive path 304. Using the bidirectional variable gain amplifiers 126-1 and 126-2, the vector modulator 404 can amplify, attenuate, or invert amplitudes of incoming signals. In other cases, the vector modulator 404 maintains an amplitude of one or more of the signals such that the amplitude remains relatively unchanged (e.g., provides buffering). In other words, the vector modulator 404 can increase an incoming signal's amplitude, decrease the incoming signal's amplitude, or keep the incoming signal's amplitude relatively unchanged.

During transmission, the quadrature coupling circuit 402 accepts the input transmit signal 216 and generates split transmit signals 414-1 and 414-2 at the quadrature ports 412-1 and 412-2, respectively. The split transmit signals 414-1 and 414-2 are approximately ninety degrees out-of-phase with respect to each other. Depending on a design of the quadrature coupling circuit 402, the split transmit signals 414-1 and 414-2 can have relatively similar amplitudes or relatively different amplitudes. The vector modulator 404 adjusts amplitudes of the split transmit signals 414-1 and 414-2 to generate amplified split transmit signals 416-1 and 416-2. Amplitudes of the amplified split transmit signals 416-1 and 416-2 can be greater than, less than, or approximately equal to amplitudes of the corresponding split transmit signals 414-1 and 414-2 to facilitate phase shifting by the phase shifter 122. The combiner 406 combines the amplified split transmit signals 416-1 and 416-2 to generate the phase-shifted transmit signal 418 at the transmit node 308. In this manner, a phase of the phase-shifted transmit signal 418 is based on a relative amplitude difference between the amplified split transmit signals 416-1 and 416-2 and the ninety-degree phase offset between the amplified split transmit signals 416-1 and 416-2 due to the quadrature coupling circuit 402.

During reception, the splitter 408 splits the input receive signal 220 to generate split receive signals 420-1 and 420-2. The split receive signals 420-1 and 420-2 are substantially in-phase with each other (e.g., have relatively similar phases). The vector modulator 404 adjusts amplitudes of the split receive signals 420-1 and 420-2 to generate amplified split receive signals 422-1 and 422-2. Similar to the amplified split transmit signals 416-1 and 416-2, amplitudes of the amplified split receive signals 422-1 and 422-2 can be greater than, less than, or approximately equal to amplitudes of the corresponding split receive signals 420-1 and 420-2, depending on a desired phase shift. The quadrature coupling circuit 402 generates a phase-shifted receive signal 424 at the shared node 306 based on the amplified split receive signals 422-1 and 422-2. In this manner, a phase of the phase-shifted receive signal 424 is based on a relative amplitude difference between the amplified split receive signals 422-1 and 422-2 and a ninety-degree phase offset that is applied via the quadrature coupling circuit 402 to one of the amplified split receive signals 422-1 or 422-2. As shown above, the phase shifter 122 performs phase shifting for both transmission and reception, and is therefore bidirectional.

FIG. 5 illustrates example operations of a phase shifter 122 for bidirectional variable gain amplification. In the depicted configuration, the quadrature coupling circuit 402 is implemented as a quadrature coupler 502 with the shared port 410 (e.g., an input or output (IO) port), a through port 504, a coupled port 506, and an isolated port 508. A signal that passes between the shared port 410 and the through port 504 has a phase that remains relatively unchanged while another signal that passes between the shared port 410 and the coupled port 506 has a phase that is shifted by approximately ninety degrees. The through port 504 and the coupled port 506 correspond to the quadrature ports 412-1 and 412-2 of FIG. 4.

The bidirectional variable gain amplifiers 126-1 and 126-2 include respective first ports 510-1 and 510-2, respective second ports 512-1 and 512-2, and respective third ports 514-1 and 514-2. The first ports 510-1 and 510-2 are disposed in the shared transceiver path of 312 (of FIG. 4) and are respectively coupled to the through port 504 and the coupled port 506. The second ports 512-1 and 512-2 are disposed in the transmit path 302 (of FIG. 4) and are coupled to the combiner 406. In contrast, the third ports 514-1 and 514-2 are disposed in the receive path 304 (of FIG. 4) and are coupled to the splitter 408.

Amplitude adjustments performed by the bidirectional variable gain amplifiers 126-1 and 126-2 are individually controlled by the control circuitry 130 via the offset signal 212. The control circuitry 130 also controls configurations of the bidirectional variable gain amplifiers 126-1 and 126-2 via the configuration signal 214. Different configurations of the bidirectional variable gain amplifiers 126-1 and 126-2 enable signals to propagate from the first ports 510-1 and 510-2 to the second ports 512-1 and 512-2, or from the third ports 514-1 and 514-2 to the first ports 510-1 and 510-2.

Example vector diagrams of signals that are accepted or generated by the phase shifter 122 are also shown in FIG. 5. Signals associated with transmission are shown within a solid-line circle and signals associated with reception are shown within a dashed-line circle. During transmission, the quadrature coupler 502 accepts the input transmit signal 216 at the shared port 410 and generates the split transmit signals 414-1 and 414-2 at the through port 504 and the coupled port 506, respectively. Due to the phase shift that occurs between the shared port 410 and the coupled port 506, the split transmit signal 414-2 has a phase that differs from a phase of the split transmit signal 414-1 by approximately ninety degrees. In other words, the split transmit signals 414-1 and 414-2 represent quadrature signals.

In this example, the bidirectional variable gain amplifier 126-1 increases an amplitude of the split transmit signal 414-1 to generate the amplified split transmit signal 416-1, and the bidirectional variable gain amplifier 126-2 decreases and inverts an amplitude of the split transmit signal 414-2 to generate the amplified split transmit signal 416-2. These adjustments to the amplitudes of the split transmit signals 414-1 and 414-2 are specified by the control circuitry 130 via the offset signal 212 to effectively shift a phase of the input transmit signal 216 by a target amount. The combiner 406 combines the amplified split transmit signals 416-1 and 416-2 to generate the phase-shifted transmit signal 418, which is shown to be a vector summation of the amplified split transmit signals 416-1 and 416-2.

During reception, the splitter 408 accepts the input receive signal 220 and generates the split receive signals 420-1 and 420-2, which are substantially in-phase with each other. In other words, the split receive signals 420-1 and 420-2 represent in-phase signals. In this example, the bidirectional variable gain amplifier 126-1 generates the amplified split receive signal 422-1 such that the amplified split receive signal 422-1 has a relatively similar amplitude as the split receive signal 420-1 (e.g., a gain of the bidirectional variable gain amplifier 126-1 is approximately zero decibels). In contrast, the bidirectional variable gain amplifier 126-2 increases an amplitude of the split receive signal 420-2 to generate the amplified split receive signal 422-2. These adjustments or lack of adjustments to the amplitudes of the split receive signals 420-1 and 420-2 are specified by the control circuitry 130 via the offset signal 212 to effectively shift a phase of the input receive signal 220 by a target amount.

The quadrature coupler 502 accepts the amplified split receive signal 422-1 at the through port 504 and accepts the amplified split receive signal 422-2 at the coupled port 506. The quadrature coupler 502 shifts a phase of the amplified split receive signal 422-2 by approximately ninety degrees to produce a phase-shifted amplified split receive signal (not explicitly shown). At the shared port 410, the quadrature coupler 502 combines the amplified split receive signal 422-1 with the phase-shifted amplified split receive signal to generate the phase-shifted receive signal 424, which is shown to be a vector summation of these signals. The bidirectional variable gain amplifier 126 is further described with respect to FIG. 6-1.

Figures 1, 6:
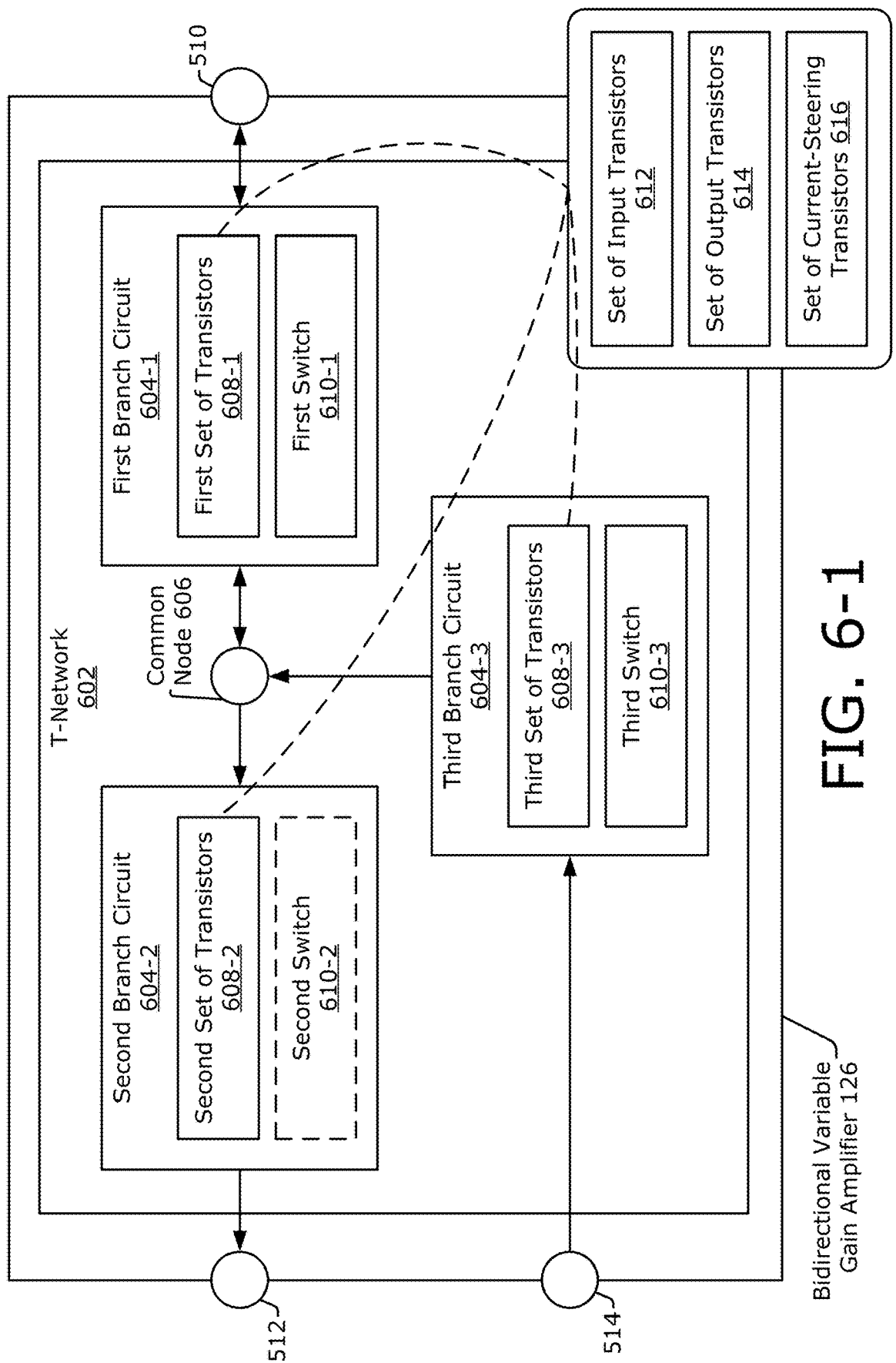
Figures 2, 6:
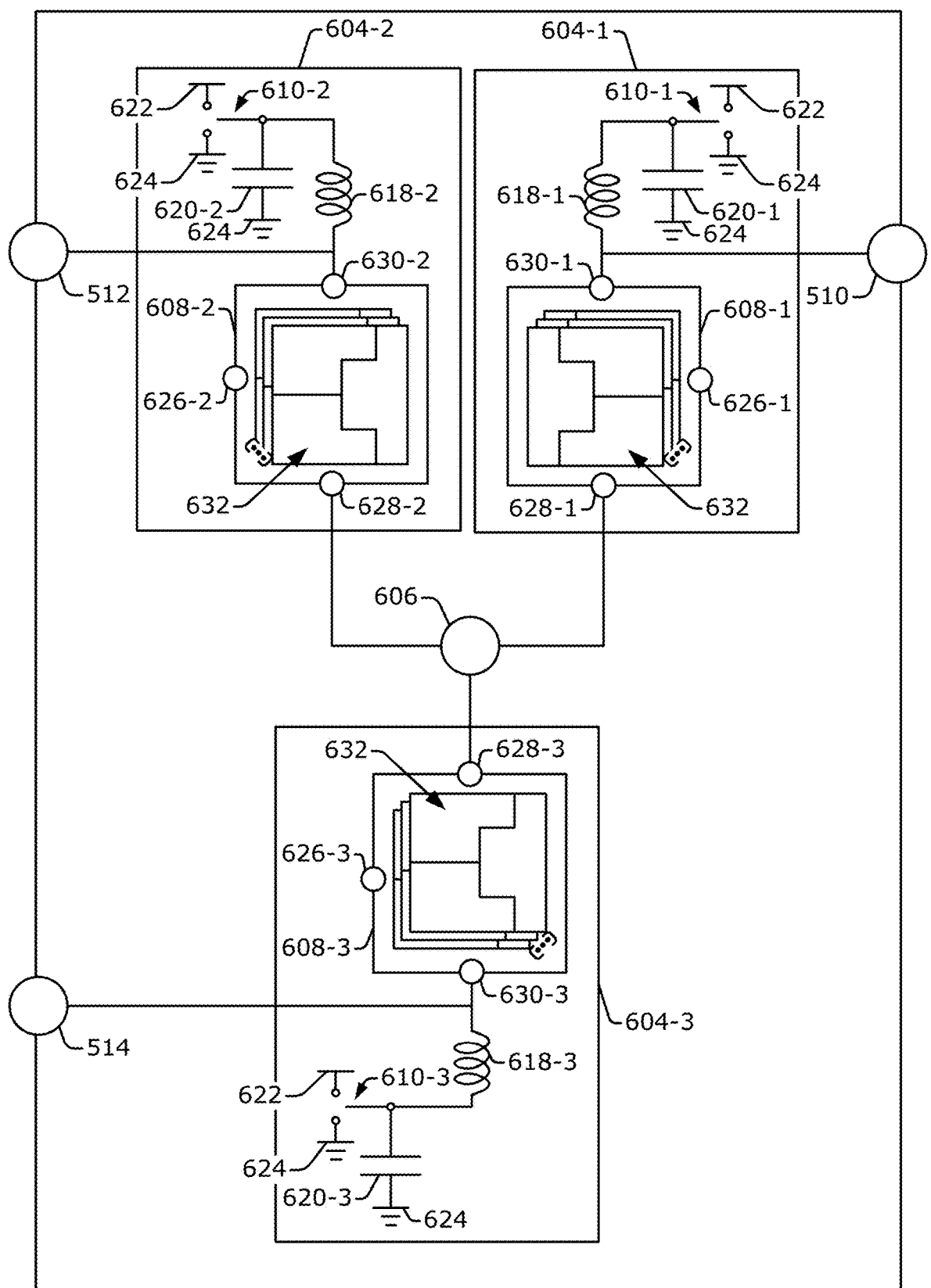

FIG. 6-1 illustrates an example implementation of a bidirectional variable gain amplifier 126, which can be used to implement each of the bidirectional variable gain amplifiers 126-1 to 126-4 of FIG. 1. The bidirectional variable gain amplifier 126 includes a T-network 602 coupled to the ports 510 and 514, and coupled to the port 512 in the three-port implementation. The T-network 602 includes three branch circuits 604-1, 604-2, and 604-3, and a common node 606. The first branch circuit 604-1 is coupled between the first port 510 and the common node 606. The second branch circuit 604-2 is coupled between the second port 512 and the common node 606. Likewise, the third branch circuit 604-3 is coupled between the third port 514 and the common node 606.

Each of the branch circuits 604-1 to 604-3 include respective sets of transistors 608-1, 608-2, and 608-3. The sets of transistors 608-1 to 608-3 each include one or more n-channel metal-oxide-semiconductor field-effect transistors (NMOSFETs) or one or more p-channel metal-oxide-semiconductor field-effect transistors (PMOSFETs). If one or more of the sets of transistors 608-1 to 608-3 include multiple transistors, the multiple transistors are coupled together in parallel. Different quantities of transistors within each set of transistors 608-1 to 608-3 can be enabled or disabled to achieve a target amount of amplification. The sets of transistors 608-1 to 608-3 can have similar or different quantities of transistors.

The branch circuits 604-1 and 604-3 include respective switches 610-1 and 610-3, which enable the bidirectional variable gain amplifier 126 to dynamically operate in an active transmit configuration or an active receive configuration. The branch circuit 604-2 can optionally include a second switch 610-2, as shown via the dashed lines, to enable the bidirectional variable gain amplifier 126 to dynamically operate in an active configuration (e.g., the active transmit configuration or the active receive configuration) or a passive configuration. The different configurations are further described with respect to FIGS. 7-1 to 7-4.

Each of the switches 610-1 to 610-3 can be implemented using an inverter, a multiplexer, one or more transistors, and so forth. The switches 610-1 to 610-3 connect the corresponding sets of transistors 608-1 to 608-3 to a supply voltage or a ground based on the configuration signal 214 (of FIG. 5). To enable the active mode 134, two of the switches 610-1 to 610-3 connect to the supply voltage and another one of the switches 610-1 to 610-3 connects to the ground. This enables a direct current (DC) current to flow from the supply voltage to the ground through at least two of the sets of transistors 608-1 to 608-3. To enable the passive mode 136, the switches 610-1 to 610-3 connect the corresponding sets of transistors 608-1 to 608-3 to the ground.

Different configurations of the switches 610-1 to 610-3 cause the sets of transistors 608-1 to 608-3 to operate as a set of input transistors 612, a set of output transistors 614, and a set of current-steering transistors 616. In the active configurations, the input set of transistors 612 generates a current based on an input voltage. The output set of transistors 614 operates as a cascode stage and generates an output voltage based on at least a portion of the current. The current-steering set of transistors 616 optionally steers another portion of the current such that the other portion of the current flows through the corresponding branch circuit to affect a magnitude of the portion of the current flowing through the output set of transistors 614. In other words, the current-steering set of transistors 616 controls an allocation of current through the output set of transistors 614 by adjusting an amount of the current that flows through the current-steering set of transistors 616. The current allocation can dynamically change to achieve a particular amount of amplification. In the passive configuration, the input set of transistors 612 and the output set of transistors 614 operate as series resistors, and the set of current-steering transistors 616 operates as a shunt resistor.

Operations of the sets of transistors 608-1 to 608-3 can vary based on the configuration of the bidirectional variable gain amplifier 126. During transmission, for example, the first set of transistors 608-1 operates as the set of input transistors 612, the second set of transistors 608-2 operates as the set of output transistors 614, and the third set of transistors 608-3 operates as the set of current-steering transistors 616. During reception, however, the third set of transistors 608-3 operates as the set of input transistors 612, the first set of transistors 608-1 operates as the set of output transistors 614, and the second set of transistors 608-2 operates as the set of current-steering transistors 616. The possible communication signal flows during transmission and reception are represented by directions of the arrows shown in FIG. 6-1. Components of the bidirectional variable gain amplifier 126 are further described with respect to FIG. 6-2.

FIG. 6-2 illustrates another example implementation of a bidirectional variable gain amplifier 126, which can be used to implement each of the bidirectional variable gain amplifiers 126-1 to 126-4 of FIG. 1. In the depicted configuration, the branch circuits 604-1 to 604-3 include the sets of transistors 608-1 to 608-3, the switches 610-1 to 610-3, respective inductors 618-1 to 618-3, and respective capacitors 620-1 to 620-3. The switches 610-1 to 610-3 each include a pole and two throws. The poles are respectively coupled to the inductors 618-1 to 618-3, and each of the two throws is respectively coupled to a supply voltage 622 and a ground 624. The switches 610-1 to 610-3 are each configured to selectively connect the corresponding set of transistors 608-1 to 608-3 to the supply voltage 622 or the ground 624. As shown in FIG. 6-2, the individual switches 610-1 to 610-3 are not coupled in series between two of the ports 510, 512, or 514 and are therefore not within a signal propagation path associated with the transmit path 302 or the receive path 304. In this manner, losses associated with switches disposed in the propagation path can be avoided.

The inductors 618-1 to 618-3 are respectively coupled between the respective poles of the switches 610-1 to 610-3 and the sets of transistors 608-1 to 608-3. The inductors 618-1 to 618-3 are configured to resonate at a desired frequency to provide a bandpass response. In particular, the inductors 618-1 to 618-3 are configured to pass higher frequencies to the output and attenuate lower frequencies. Each inductor 618-1 to 618-3 also operates as a dummy load if the corresponding set of transistors 608-1 to 608-3 operates as the set of current-steering transistors 616. The capacitors 620-1 to 620-3 are coupled between the respective poles of the switches 610-1 to 610-3 and the ground 624. In this manner, the capacitors 620-1 to 620-3 comprise bypass capacitors that cause the high-frequency signal to "see" a small impedance at the switches 610-1 to 610-3. The capacitors 620-1 to 620-3 can be optional components that may not be included in some implementations.

Each of the sets of transistors 608-1 to 608-3 include respective gate terminals 626-1, 626-2, and 626-3, respective channel terminals 628-1, 628-2, 628-3, and other respective channel terminals 630-1, 630-2, 630-3. Additionally, each of the sets of transistors 608-1 to 608-3 include at least one common-gate amplifier 632. If one or more of the sets of transistors 608-1 to 608-3 include multiple common-gate amplifiers 632, the multiple common-gate amplifiers 632 are connected together in parallel. In general, the common-gate amplifiers 632 are symmetrical such that a DC current can flow from the channel terminal 628 to the channel terminal 630, or from the channel terminal 630 to the channel terminal 628 based on a bias voltage provided via the switch 610. This enables bidirectional operation of the bidirectional variable gain amplifier 126.

The gate terminals 626-1 to 626-3 are coupled to a voltage generator (not shown), which can be implemented within the wireless transceiver 120 and generates individual gate voltages. If the sets of transistors 608-1 to 608-3 each include multiple transistors, each of the gate terminals 626-1 to 626-3 can comprise multiple gate terminals coupled to individual transistors within the sets of transistors 608-1 to 608-3. In this way, the voltage generator can generate different gate voltages to cause different quantities of transistors within the sets of transistors 608-1 to 608-3 to operate in an enabled state (e.g., operate in either a saturation region or a linear region) or a disabled state (e.g., operate in a cut-off region). In the enabled state, current flows through the transistor. In the disabled state, current does not substantially flow through the transistor. Based on the gate voltages, the transistors within the set of transistors 608-1 to 608-3 can operate as amplifiers or switches. The gate voltages can be associated with analog signals or digital signals that are generated by the voltage generator. Generally, the voltage generator generates a set of gate voltages for the set of input transistors 612 and another set of gate voltages for the set of output transistors 614 and the set of current-steering transistors 616. In the active configuration, the gate voltages are bias voltages that cause the transistors to operate as amplifiers. In the passive configuration, the gate voltages are ground voltages, supply voltages, or a combination thereof that cause the transistors to operate as switches.

Respective channel terminals 628-1 to 628-3 and 630-1 to 630-3 are connected to terminals of the transistors within the set of transistors 608-1 to 608-3 that have a same doping type. The switches 610-1 to 610-3 provide a bias voltage at the channel terminals 630-1 to 630-3, which causes the channel terminals 630-1 to 630-3 to represent source terminals or drain terminals. If, for example, the transistors are NMOSFETs and the switches 610-1 to 610-3 connect the channel terminals 630-1 to 630-3 to the ground 624, the channel terminals 630-1 to 630-3 represent source terminals, and the channel terminals 628-1 to 628-3 represent drain terminals. Alternatively, if the switches 610-1 to 610-3 connect the channel terminals 630-1 to 630-3 to the supply voltage 622, the channel terminals 630-1 to 630-3 represent drain terminals. T Different configurations of an example three-port bidirectional variable gain amplifier 126 are further described with respect to FIGS. 7-1 to 7-3. The three-port bidirectional variable gain amplifier 126 can be used to implement the bidirectional variable gain amplifiers 126-1 and 126-2 of the phase shifter 122 or the bidirectional variable gain amplifier 126-3 of the three-port amplifier 124. An example two-port bidirectional variable gain amplifier 126 is further described with respect to FIG. 7-4. The two-port bidirectional variable gain amplifier 126 can be used to implement the bidirectional variable gain amplifier 126-4 of the two-port amplifier 138.

FIG. 7-1 illustrates an active transmit configuration 700-1 of an example three-port bidirectional variable gain amplifier 126. In this configuration, the control circuitry 130 causes, via the configuration signal 214 (not shown), the first switch 610-1 to connect the first set of transistors 608-1 to the ground 624. The control circuitry 130 also causes, via the configuration signal 214, both the second switch 610-2 and the third switch 610-3 to respectively connect the set of transistors 608-2 and 608-3 to the supply voltage 622. In the active transmit configuration 700-1, the voltage generator provides bias voltages to the gate terminals 626-1, 626-2, and 626-3 and the transistors within the sets of transistors 608-1 to 608-3 operate as amplifiers within the T-network 602.

In the active transmit configuration 700-1, a signal propagates through the first set of transistors 608-1 and the second set of transistors 608-2 from the first port 510 to the second port 512. As such, the first set of transistors 608-1 operates as the set of input transistors 612, and the second set of transistors 608-2 operates as the set of output transistors 614. In particular, the first set of transistors 608-1 accepts an input voltage 702 at the first port 510 and generates a current 704 based on the input voltage 702. At least a portion of the current 704 flows through the second set of transistors 608-2, as shown by current 706. The second set of transistors 608-2 generates an output voltage 708 at the second port 512 based on the current 706. In some situations, all of the transistors within the set of input transistors 612 are in the enabled state.

If at least a portion of the transistors within the third set of transistors 608-3 are in the enabled state, another portion of the current 704 flows through the third set of transistors 608-3, as represented by current 710. The directions of the arrows shown with respect to the currents 704, 706, and 710 represent a direction of the DC current. The third set of transistors 608-3 therefore can operate as the set of current-steering transistors 616 to allocate an amount of the current 706 that flows through the second set of transistors 608-2. Thus, the gain of the bidirectional variable gain amplifier 126 is decreased relative to a configuration in which all of the transistors within the set of current-steering transistors 616 are in the disabled state. Based on the current 710, a current-steering voltage 712 is generated at the third port 514. In some cases, the control circuitry 130 causes a transceiver component (e.g., the low-noise amplifier 208) that is coupled to the third port 514 to be in a disabled state during the active transmit configuration 700-1.

Together, the set of output transistors 614 and the set of current-steering transistors 616 jointly control an amplitude of the output voltage 708. Generally, the gain of the bidirectional variable gain amplifier 126 is based on a quantity of transistors within the set of output transistors 614 that are in the enabled state and a quantity of transistors within the set of current-steering transistors 616 that are in the enabled state. In particular, this ratio controls amounts of the currents 706 and 710 that respectively flow through the set of output transistors 614 and the set of current-steering transistors 616. In general, an amplitude of the output voltage 708 increases as a quantity of transistors that are in the enabled state within the set of output transistors 614 increases.

In some cases, a total quantity of transistors that are in the enabled state across both the set of output transistors 614 and the set of current-steering transistors 616 is based on a predetermined number. For instance, if overall quantities of transistors within the set of output transistors 614 and the set of current-steering transistors 616 are equal, the predetermined number can represent this quantity. To adjust the gain of the bidirectional variable gain amplifier 126 and keep the total quantity of transistors that are in the enabled state across both the set of output transistors 614 and the set of current-steering transistors 616 equal to the predetermined number, an increase in a quantity of transistors that are in the enabled state within the set of output transistors 614 can result in a similar decrease in a quantity of transistors that are in the enabled state within the set of current-steering transistors 616, or vice versa.

FIG. 7-2 illustrates an active receive configuration 700-2 of an example three-port bidirectional variable gain amplifier 126. In this configuration, the control circuitry 130 causes, via the configuration signal 214 (not shown), the third switch 610-3 to connect the third set of transistors 608-3 to the ground 624. The control circuitry 130 also causes, via the configuration signal 214, both the first switch 610-1 and the second switch 610-2 to respectively connect the sets of transistors 608-1 and 608-2 to the supply voltage 622. In the active receive configuration 700-2, the voltage generator provides bias voltages to the gate terminals 626-1, 626-2, and 626-3 and the transistors within the sets of transistors 608-1 to 608-3 operate as amplifiers within the T-network 602.

In the active receive configuration 700-2, a signal propagates through the third set of transistors 608-3 and the first set of transistors 608-1 from the third port 514 to the first port 510. As such, the third set of transistors 608-3 operate as the set of input transistors 612 and the first set of transistors 608-1 operate as the set of output transistors 614. If at least a portion of the transistors within the second set of transistors 608-2 are in the enabled state, the second set of transistors 608-2 operate as the set of current-steering transistors 616. Respective operations of the set of input transistors 612, the set of output transistors 614, and the set of current-steering transistors 616 are similar to those described above with reference to FIG. 7-1. In some cases, the control circuitry 130 causes a transceiver component (e.g., the power amplifier 206) that is coupled to the second port 512 to be in a disabled state during the active receive configuration 700-2.

FIG. 7-3 illustrates a passive configuration 700-3 of an example three-port bidirectional variable gain amplifier 126.

In this configuration, the control circuitry 130 causes, via the configuration signal 214 (not shown), the switches 610-1 to 610-3 to connect the sets of transistors 608-1 to 608-3 to the ground 624. In the passive configuration 700-3, the voltage generator connects the supply voltage 622 or the ground 624 to the gate terminals 626-1, 626-2, and 626-3, which causes the transistors within the sets of transistors 608-1 to 608-3 to act as switches. As such, the sets of transistors 608-1 to 608-3 operate as variable resistors within the T-network 602. Changing quantities of transistors that are in the enabled state within the set of transistors 608-1 to 608-3 changes effective resistances of the set of transistors 608-1 to 608-3.

During transmission in the passive configuration 700-3, a signal propagates through the first set of transistors 608-1 and the second set of transistors 608-2 from the first port 510 to the second port 512, similar to the active transmit configuration 700-1 of FIG. 7-1. As such, the sets of transistors 608-1 and 608-2 operate as series resistors and the third set of transistors 608-3 operates as a shunt resistor. By adjusting the effective resistances of the sets of transistors 608-1 to 608-3, the signal is attenuated by a target amount at the second port 512.

During reception in the passive configuration 700-3, a signal propagates through the third set of transistors 608-3 and the first set of transistors 608-1 from the third port 514 to the first port 510, similar to the active receive configuration 700-2 of FIG. 7-2. As such, the sets of transistors 608-1 and 608-3 operate as series resistors and the second set of transistors 608-2 operates as a shunt resistor. By adjusting the effective resistances of the sets of transistors 608-1 to 608-3, the signal is attenuated by a target amount at the first port 510.

FIG. 7-4 illustrates an example two-port bidirectional variable gain amplifier 126, which can be disposed within the shared transceiver path 312. As such, the wireless transceiver 120 can use the bidirectional variable gain amplifier 126 to provide variable gain amplification for both transmission and reception. This enables the wireless transceiver 120 to conserve area relative to other designs that utilize separate variable gain amplifiers for transmission and reception. The bidirectional variable gain amplifier 126 can implement the two-port amplifier 138 of FIG. 2-3, which can operate as an amplifier, an attenuator, or a buffer within the shared transceiver path 312.

In FIGS. 7-1 to 7-3, different ports of the three-port bidirectional variable gain amplifier 126 behave as the input port or the output port depending on the operational mode. In FIG. 7-4, however, the ports 510 and 514 of the two-port bidirectional variable gain amplifier 126 respectively behave as the input port and the output port for transmission, and respectively behave as the output port and the input port for reception. For example, in the active transmit configuration 700-1, the first port 510 behaves as the input port and the third port 514 behaves as the output port. In the active receive configuration 700-2, however, the third port behaves as the input port and the first port behaves as the output port. As such, the first set of transistors 608-1 operates as the set of input transistors 612 and the third set of transistors 608-3 operates as the set of output transistors 614, or vice versa. The second set of transistors 608-2 operates as the set of current-steering transistors 616. Respective operations of the set of input transistors 612, the set of output transistors 614, and the set of current-steering transistors 616 are similar to those described above with reference to FIGS. 7-1 to 7-3.

In the active transmit configuration 700-1, for example, a signal propagates through the first set of transistors 608-1 and the third set of transistors 608-3 from the first port 510 to the third port 514. To realize this, the first switch 610-1 connects the first set of transistors 608-1 to the ground 624, and the first set of transistors 608-1 operates as the set of input transistors 612. The third switch 610-3 connects the third set of transistors 608-3 to the supply voltage 622, and the third set of transistors 608-3 operates as the set of output transistors 614.

In the active receive configuration 700-2, a signal propagates through the third set of transistors 608-3 and the first set of transistors 608-1 from the third port 514 to the first port 510. To realize this, the third switch 610-3 connects the third set of transistors 608-3 to the ground 624, and the third set of transistors 608-3 operates as the set of input transistors 612. The first switch 610-1 connects the first set of transistors 608-1 to the supply voltage 622, and the first set of transistors 608-1 operates as the set of output transistors 614.

In both the active transmit configuration 700-1 and the active receive configuration 700-2, the second set of transistors 608-2 operates as the set of current-steering transistors 616 and allocates an amount of current that flows through the set of output transistors 614. To realize this, the second switch 610-2 connects the second set of transistors 608-2 to the supply voltage 622.

During both transmission and reception in the passive configuration 700-3, the first and third sets of transistors 608-1 and 608-3 operate as series resistors, and the second set of transistors 608-2 operates as a shunt resistor. The first switch 610-1 connects the first set of transistors 608-1 to the ground 624, the second switch 610-2 connects the second set of transistors 608-2 to the ground 624, and the third switch 610-3 connects the third set of transistors 608-3 to the ground 624.

Although the above circuits in FIGS. 2 to 7-4 are shown as single-ended circuits, at least some of the circuits can alternatively be implemented as differential circuits. Also, if the bidirectional variable gain amplifier 126 is implemented such that the second branch circuit 604-2 does not include the switch 610-2, the channel terminal 630-2 can be coupled to the supply voltage 622. In this implementation, the inductor 618-2 can optionally be removed such that the channel terminal 630-2 is directly coupled to the supply voltage 622.

Figure 8:
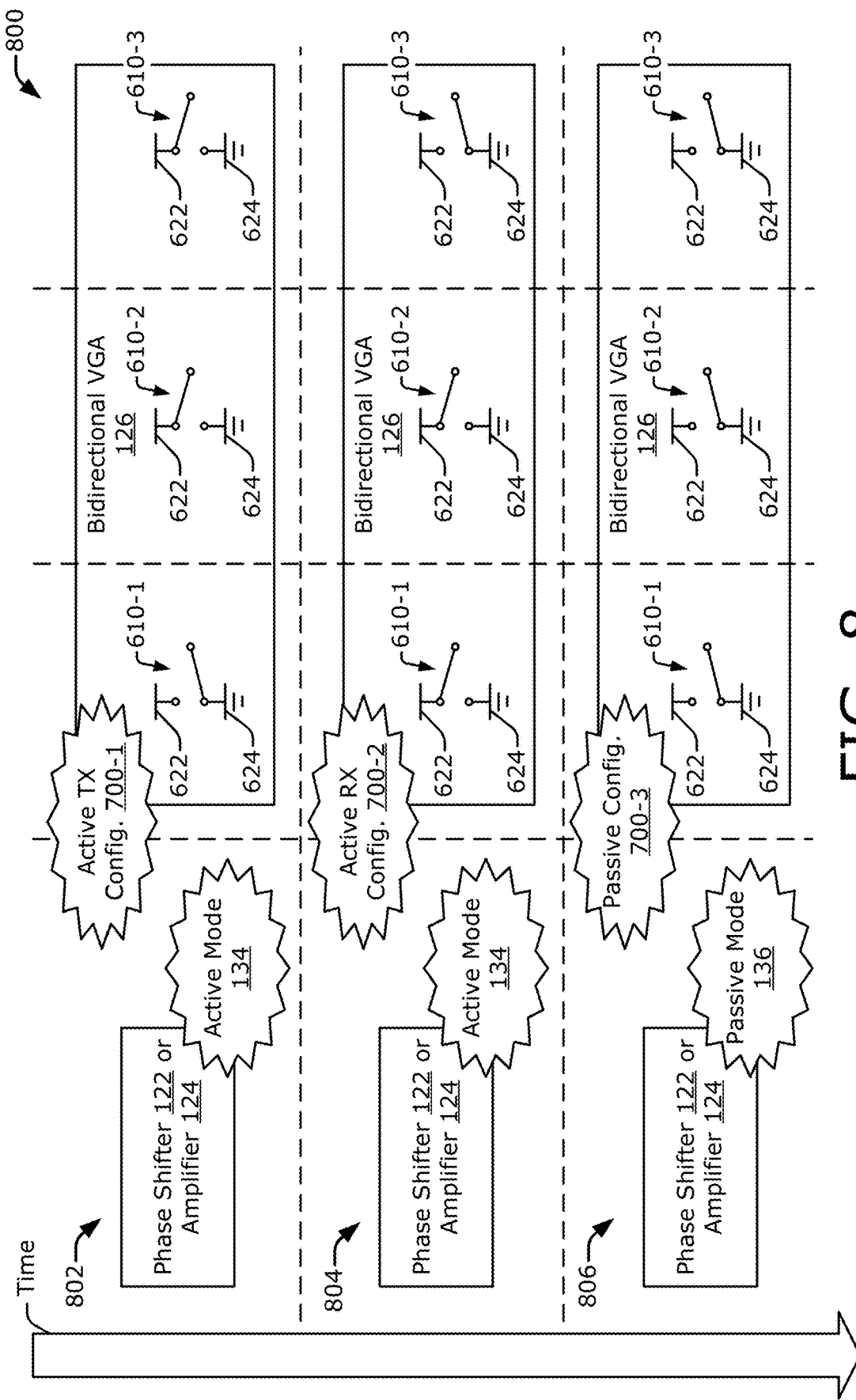
FIG. 8 illustrates an example sequence flow diagram for switching between different configurations of a bidirectional variable gain amplifier for bidirectional variable gain amplification.

FIG. 8 illustrates an example sequence flow diagram 800 for switching between different operational modes of a phase shifter 122, a three-port amplifier 124, or a two-port amplifier 138 that includes at least one bidirectional variable gain amplifier 126, with time elapsing in a downward direction. At 802 and 804, the phase shifter 122, the three-port amplifier 124, or the two-port amplifier 138 operates in the active mode 134, which consumes power and enables the phase shifter 122, the three-port amplifier 124, or the two-port amplifier 138 to improve performance of the wireless transceiver 120.

During the active mode 134, the bidirectional variable gain amplifier 126 (e.g., the three-port bidirectional variable gain amplifier illustrated in FIGS. 7-1 and 7-2 or the two-port bidirectional variable gain amplifier illustrated in FIG. 7-4) can operate in the active transmit (TX) configuration 700-1 (of FIG. 7-1) or the active receive (RX) configuration 700-2 (of FIG. 7-2). At 802, for instance, the bidirectional variable gain amplifier 126 operates in the active transmit configuration 700-1 based on the first switch 610-1 connecting the first port 510 to the ground 624 and based on the second and third switches 610-2 and 610-3 respectively connecting the ports 512 and 514 to the supply voltage 622 as shown. At 804, the bidirectional variable gain amplifier 126 operates in the active receive configuration 700-2 based on the third switch 610-3 connecting the third port 514 to the ground 624 and based on the first and second switches 610-1 and 610-2 respectively connecting the ports 510 and 512 to the supply voltage 622 as shown.

The control circuitry 130 can cause the bidirectional variable gain amplifier 126 to dynamically switch between the active transmit configuration 700-1 and the active receive configuration 700-2 based on an operational mode (e.g., a transmit mode or a receive mode) of the wireless transceiver 120 at a particular time. In this way, the performance improvements of the active mode 134 can be realized during both transmission and reception using the bidirectional variable gain amplifier 126.

At 806, the phase shifter 122, the three-port amplifier 124, or the two-port amplifier 138 operates in the passive mode 136, which conserves power (e.g., does not substantially consume power from the DC current) but realizes lower performance relative to the active mode 134. During the passive mode 136, the bidirectional variable gain amplifier 126 (e.g., the three-port bidirectional variable gain amplifier 126 of FIG. 7-3 or the two-port bidirectional variable gain amplifier 126 of FIG. 7-4) operates in the passive configuration 700-3 based on the switches 610-1 to 610-3 respectively connecting the ports 510, 512, and 514 to the ground 624 as shown in FIG. 8.

In some implementations, the control circuitry 130 can cause the phase shifter 122, the three-port amplifier 124, or the two-port amplifier 138 to dynamically switch between the active mode 134 and the passive mode 136 to balance power consumption with performance. In some cases, the active mode 134 can be used if the wireless transceiver 120 is coupled to a relatively larger antenna array having four or more antenna elements 202, and the passive mode 136 can be used if the wireless transceiver 120 is coupled to a relatively smaller antenna array having less than four antenna elements 202.

Figure 9:
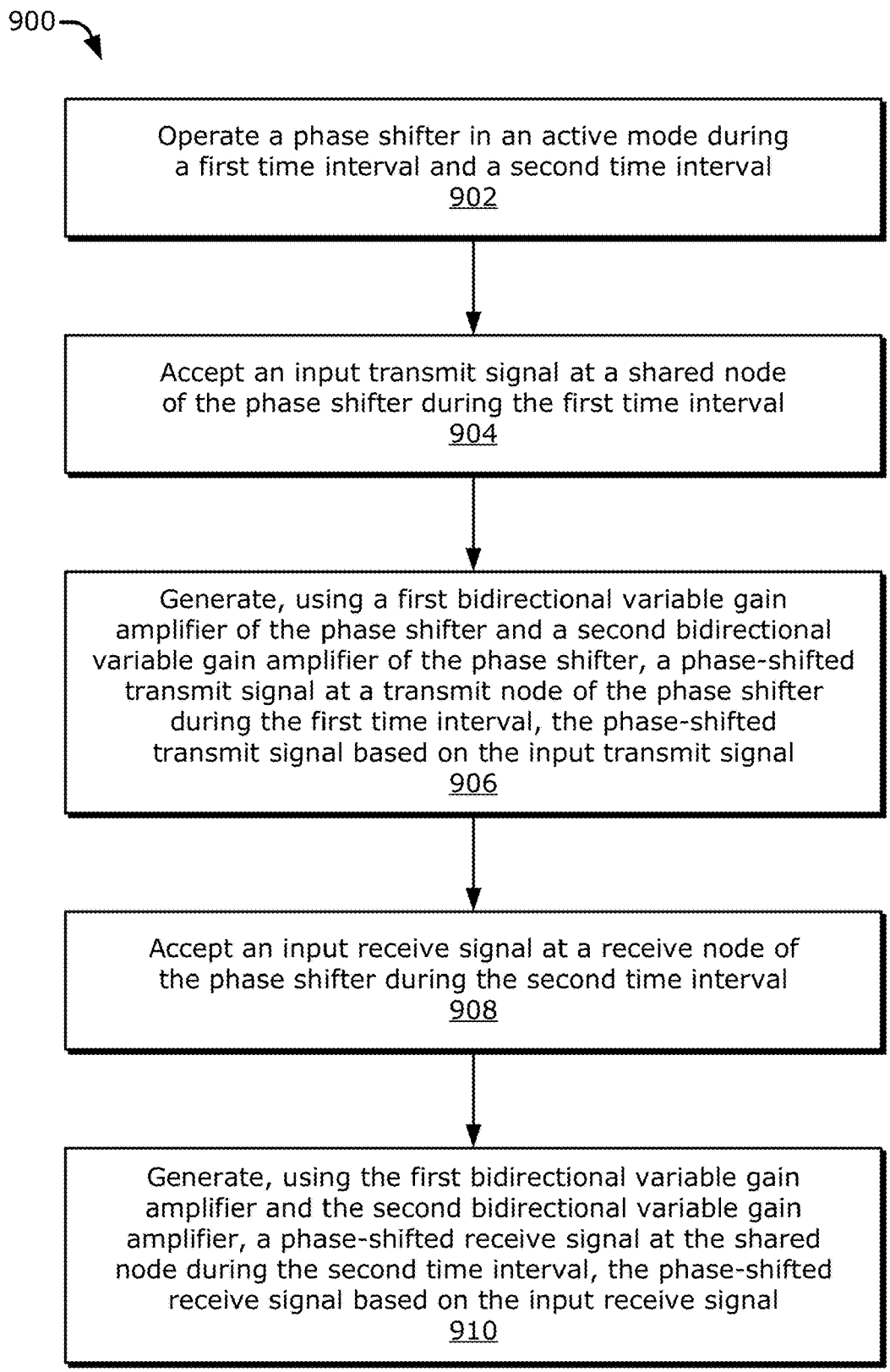
FIG. 9 is a flow diagram illustrating an example process for bidirectional variable gain amplification.

FIG. 9 is a flow diagram illustrating an example process 900 for bidirectional variable gain amplification. The process 900 is described in the form of a set of blocks 902-910 that specify operations that can be performed. However, operations are not necessarily limited to the order shown in FIG. 9 or described herein, for the operations may be implemented in alternative orders or in fully or partially overlapping manners. Operations represented by the illustrated blocks of the process 900 may be performed by the wireless transceiver 120 (e.g., of FIG. 1 or 2) or a phase shifter 122 (e.g., of FIGS. 2 to 5). More specifically, the operations of the process 900 may be performed, at least partially, by a bidirectional variable gain amplifier 126 as shown in FIGS. 6-1 to 7-4.

At block 902, a phase shifter is operated in an active mode during a first time interval and a second time interval. For example, the phase shifter 122 operates in the active mode 134 during a first time interval associated with identifier 802 of FIG. 8 and during a second time interval associated with identifier 804 of FIG. 8. During the active mode 134, the bidirectional variable gain amplifiers 126-1 and 126-2 within the phase shifter 122 can be in the active transmit configuration 700-1 (of FIG. 7-1) or the active receive configuration 700-2 (of FIG. 7-2).

At block 904, an input transmit signal is accepted at a shared node of the phase shifter during the first time interval. For example, the phase shifter 122 accepts the input transmit signal 216 at the shared node 306. The quadrature coupling circuit 402 can generate split transmit signals 414-1 and 414-2 based on the input transmit signal 216, as shown in FIG. 4.

At block 906, a phase-shifted transmit signal is generated at a transmit node of the phase shifter during the first time interval using a first bidirectional variable gain amplifier of the phase shifter and a second bidirectional variable gain amplifier of the phase shifter. The phase-shifted transmit signal is based on the input transmit signal. For example, the phase shifter 122 uses the bidirectional variable gain amplifiers 126-1 and 126-2 to generate a phase-shifted transmit signal 418 at the transmit node 308, as shown in FIG. 4. The phase-shifted transmit signal 418 is based on the input transmit signal 216 and can have a different phase and/or a different amplitude relative to the input transmit signal 216. In particular, the bidirectional variable gain amplifiers 126-1 and 126-2 can adjust respective amplitudes of the split transmit signals 414-1 and 414-2, which are associated with the input transmit signal 216, to generate the amplified split transmit signals 416-1 and 416-2. The combiner 406 combines the amplified split transmit signals 416-1 and 416-2 to generate the phase-shifted transmit signals 418. During transmission, the two bidirectional variable gain amplifiers 126-1 and 126-2 are respectively associated with an in-phase channel and a quadrature channel within the phase shifter 122.

At block 908, an input receive signal is accepted at a receive node of the phase shifter during the second time interval. For example, the phase shifter 122 accepts the input receive signal 220 at the receive node 310. The splitter 408 can generate split receive signals 420-1 and 420-2 based on the input receive signal 220, as shown in FIG. 4.

At block 910, a phase-shifted receive signal is generated at the shared node during the second time interval using the first bidirectional variable gain amplifier and the second bidirectional variable gain amplifier. The phase-shifted receive signal is based on the input receive signal. For example, the phase shifter 122 uses the bidirectional variable gain amplifiers 126-1 and 126-2 to generate the phase-shifted receive signal 424 at the shared node 306, as shown in FIG. 4. The phase-shifted receive signal 424 is based on the input receive signal 220 and can have a different phase and/or a different amplitude relative to the input receive signal 220. In particular, the bidirectional variable gain amplifiers 126-1 and 126-2 can adjust respective amplitudes of the split receive signals 420-1 and 420-2, which are associated with the input receive signal 220, to generate the amplified split receive signals 422-1 and 422-2. During reception, the two bidirectional variable gain amplifiers 126-1 and 126-2 are respectively associated with two in-phase channels within the phase shifter 122. The quadrature coupling circuit 402 can generate the phase-shifted receive signal 424 based on the amplified split receive signals 422-1 and 422-2, as shown in FIG. 4.

FIG. 10 is another flow diagram illustrating an example process 1000 for bidirectional variable gain amplification. The process 1000 is described in the form of a set of blocks 1002-1008 that specify operations that can be performed. However, operations are not necessarily limited to the order shown in FIG. 10 or described herein, for the operations may be implemented in alternative orders or in fully or partially overlapping manners. Operations represented by the illustrated blocks of the process 1000 may be performed by the wireless transceiver 120 (e.g., of FIG. 1 or 2) or a phase shifter 122 (e.g., of FIGS. 2 to 5). More specifically, the operations of the process 1000 may be performed, at least partially, by a bidirectional variable gain amplifier 126 as shown in FIGS. 6-1 to 7-4.

At 1002, a bidirectional variable gain amplifier is operated in an active transmit configuration during a first time interval. The bidirectional variable gain amplifier comprises a first port and a third port. For example, the bidirectional variable gain amplifier 126 operates in the active transmit configuration 700-1 during a first time interval. The bidirectional variable gain amplifier 126 comprises the first port 510 and the third port 514, as shown in FIGS. 6-1 to 7-4.

At 1004, a first signal that propagates from the first port to the third port in the active transmit configuration is amplified. For example, the bidirectional variable gain amplifier 126 of FIG. 7-4 amplifies a first signal that propagates from the first port 510 to the third port 514 in the active transmit configuration 700-1.

At 1006, the bidirectional variable gain amplifier operates in an active receive configuration during a second time interval. For example, the bidirectional variable gain amplifier 126 operates in the active receive configuration 700-2 during a second time interval.

At 1008, a second signal that propagates from the third port to the first port in the active receive configuration is amplified. For example, the bidirectional variable gain amplifier 126 amplifies a second signal that propagates from the third port 514 to the first port 510 in the active receive configuration 700-2.

The elements or circuits described herein are sometimes referred to as means for achieving a particular property or function. In connection with the described aspects, an apparatus comprises: an antenna element of an antenna array configured to: transmit a phase-shifted transmit signal; and receive an input receive signal; and a wireless transceiver. The wireless transceiver comprises: a transmit path coupled to the antenna element; a receive path coupled to the antenna element; and a phase shifter disposed in both the transmit path and the receive path, the phase shifter configured to operate in an active mode to: generate the phase-shifted transmit signal based on an input transmit signal; and generate a phase-shifted receive signal based on the input receive signal, the phase shifter comprising vector modulation means for adjusting amplitudes of two split transmit signals that are associated with the input transmit signal and adjusting amplitudes of two split receive signals that are associated with the input receive signal. For example, the vector modulation means may correspond to the vector modulator 404.

In some embodiments, the phase shifter comprises a quadrature coupling circuit, the quadrature coupling circuit comprising a first quadrature port and a second quadrature port; the vector modulation means is coupled to the first quadrature port and the second quadrature port; the two split transmit signals comprise quadrature signals having phases that differ by approximately ninety degrees from each other; and the two split receive signals comprise in-phase signals having other phases that are approximately equal to each other.

In some embodiments, the vector modulation means comprises: first bidirectional amplification means for amplifying a first split transmit signal of the two split transmit signals and amplifying a first split receive signal of the two split receive signals; and second bidirectional amplification means for amplifying a second split transmit signal of the two split transmit signals and amplifying a second split receive signal of the two split receive signals. For example, the first bidirectional amplification means may correspond to the first bidirectional amplifier 126-1 and the second bidirectional amplification means may correspond to the second bidirectional amplifier 126-2.

In some embodiments, the first bidirectional amplification means comprises: a first port disposed in both the transmit path and the receive path, the first port configured to accept the first split transmit signal; a second port disposed in the transmit path; a third port disposed in the receive path, the third port configured to accept the first split receive signal; and first duplexing means for selectively providing, based on the first split transmit signal, a first amplified split transmit signal at the second port and providing, based on the first split receive signal, a first amplified split receive signal at the first port, the first duplexing means coupled to the first port, the second port, and the third port. The second bidirectional amplification means comprises: another first port disposed in both the transmit path and the receive path, the other first port configured to accept the second split transmit signal; another second port disposed in the transmit path; another third port disposed in the receive path, the other third port configured to accept the second split receive signal; and second duplexing means for selectively providing, based on the second split transmit signal, a second amplified split transmit signal at the other second port and providing, based on the second split receive signal, a second amplified split receive signal at the other first port, the second duplexing means coupled to the other first port, the other second port, and the other third port. For example, the first duplexing means may correspond to an instance of the first branch circuit 604-1, the second branch circuit 604-2, and the third branch circuit 604-3, and the second duplexing means may correspond to another instance of the first branch circuit 604-1, the second branch circuit 604-2, and the third branch circuit 604-3.

In some embodiments, the first duplexing means comprises: first input means for respectively generating a first current based on a first input voltage, the first input voltages selectively associated with the first split transmit signal and the first split receive signal; and first output means for respectively generating a first output voltage based on at least a portion of the first current, the first output voltage selectively associated with the first amplified split transmit signal and the first amplified split receive signal. The second duplexing means comprises: second input means for respectively generating a second current based on a second input voltage, the second input voltages selectively associated with the second split transmit signal and the second split receive signal; and second output means for respectively generating a second output voltage based on at least a portion of the second current, the second output voltage selectively associated with the second amplified split transmit signal and the second amplified split receive signal. For example, the first input means may correspond to an instance of the set of input transistors 612, and the first output means may correspond to an instance of the set of output transistors 614. The second input means may correspond to another instance of the set of input transistors 612, and the second output means may correspond to another instance of the set of output transistors 614.

In some embodiments, the first duplexing means comprises first current-steering means for allocating an amount of the first current that flows through the first output means; and the second duplexing means comprises second current-steering means for allocating an amount of the second current that flows through the second output means. For example, the first current-steering means may correspond to an instance of the set of current-steering transistors 616 and the second current-steering means may correspond to another instance of the set of current-steering transistors 616.

In some embodiments, the first duplexing means comprises first switching means for connecting the first input means to a ground and connecting the first output means and the first current-steering means to a supply voltage; and the second duplexing means comprises second switching means for connecting the second input means to the ground and connecting the second output means and the second current-steering means to the supply voltage. For example, the first switching means may correspond to the first switch 610-1, the second switch 610-2, and the third switch 610-3 in the configuration as shown in FIG. 7-1, and the second switching means may correspond to the first switch 610-1, the second switch 610-2, and the third switch 610-3 in the configuration as shown in FIG. 7-2.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An apparatus comprising:
    an antenna element of an antenna array; and
    a wireless transceiver comprising:
        a transmit path coupled to the antenna element;
        a receive path coupled to the antenna element; and
        a phase shifter disposed in both the transmit path and the receive path, the phase shifter configured to operate in an active mode, the phase shifter comprising:
            a first bidirectional variable gain amplifier; and
            a second bidirectional variable gain amplifier.

2. The apparatus of claim 1, wherein the phase shifter is configured, based on being in the active mode, to selectively:
    amplify a first signal that propagates through the transmit path using both the first bidirectional variable gain amplifier and the second bidirectional variable gain amplifier in a transmit mode; and
    amplify a second signal that propagates through the receive path using both the first bidirectional variable gain amplifier and the second bidirectional variable gain amplifier in a receive mode.

3. The apparatus of claim 2, wherein the phase shifter is configured to amplify the first signal and amplify the second signal by a factor that is greater than one.

4. The apparatus of claim 1, wherein the phase shifter comprises a vector modulator, the vector modulator comprising the first bidirectional variable gain amplifier and the second bidirectional variable gain amplifier.

5. The apparatus of claim 1, wherein the phase shifter comprises a quadrature coupling circuit, the quadrature coupling circuit comprising:
    a first quadrature port coupled to the first bidirectional variable gain amplifier; and
    a second quadrature port coupled to the second bidirectional variable gain amplifier.

6. The apparatus of claim 5, wherein the first quadrature port and the second quadrature port are associated with a phase delta of approximately ninety degrees.

7. The apparatus of claim 5, wherein:
    the first bidirectional variable gain amplifier and the first quadrature port are associated with a first in-phase channel of the transmit path and a second in phase channel of the receive path; and
    the second bidirectional variable gain amplifier and the second quadrature port are associated with a quadrature channel of the transmit path and a third in phase channel of the receive path.

8. The apparatus of claim 1, wherein:
    the first bidirectional variable gain amplifier comprises a first set of transistors configured to selectively:
        operate as a first set of input transistors based on an active transmit configuration; and
        operate as a first set of output transistors based on an active receive configuration; and
    the second bidirectional variable gain amplifier comprises a second set of transistors configured to selectively:
        operate as a second set of input transistors based on the active transmit configuration; and
        operate as a second set of output transistors based on the active receive configuration.

9. The apparatus of claim 1, wherein the first bidirectional variable gain amplifier and the second bidirectional variable gain amplifier each comprise different ones of the following:
    a first port disposed in both the transmit path and the receive path;
    a second port disposed in the transmit path;
    a third port disposed in the receive path; and
    a T-network coupled to the first port, the second port, and the third port, the T-network comprising:
        a common node; and
        a first branch circuit coupled between the first port and the common node, the first branch circuit comprising a first set of transistors, the first set of transistors comprising at least one first common-gate amplifier;
        a second branch circuit coupled between the second port and the common node, the second branch circuit comprising a second set of transistors, the second set of transistors comprising at least one second common-gate amplifier; and
        a third branch circuit coupled between the third port and the common node, the third branch circuit comprising a third set of transistors, the third set of transistors comprising at least one third common-gate amplifier.

10. The apparatus of claim 9, wherein:
    the first branch circuit comprises a first switch, the first switch configured to selectively:
        connect a first channel terminal of the first set of transistors to a supply voltage; and
        connect the first channel terminal of the first set of transistors to a ground;
    the second branch circuit is configured to connect a second channel terminal of the second set of transistors to the supply voltage; and
    the third branch circuit comprises a third switch, the third switch configured to selectively:
        connect a third channel terminal of the third set of transistors to the supply voltage; and
        connect the third channel terminal of the third set of transistors to the ground.

11. The apparatus of claim 10, wherein:
the first branch circuit comprises a first inductor coupled between the first switch and the first channel terminal of the first set of transistors; and
the third branch circuit comprises a third inductor coupled between the third switch and the third channel terminal of the third set of transistors.

12. The apparatus of claim 10, wherein:
the first switch is configured to connect the first channel terminal of the first set of transistors to the ground in an active transmit configuration, the active transmit configuration based on the active mode of the phase shifter; and
the third switch is configured to connect the third channel terminal of the third set of transistors to the supply voltage in the active transmit configuration.

13. The apparatus of claim 12, wherein:
the first set of transistors is configured to:
  accept an input voltage at the first port in the active transmit configuration, the input voltage associated with a split transmit signal; and
  generate a current based on the input voltage in the active transmit configuration; and
the second set of transistors is configured to generate, based on at least a portion of the current, an output voltage at the second port in the active transmit configuration, the output voltage associated with an amplified split transmit signal.

14. The apparatus of claim 13, wherein:
the third set of transistors is configured to allocate an amount of the current that flows through the second set of transistors in the active transmit configuration.

15. The apparatus of claim 12, wherein:
the first switch is configured to connect the first channel terminal of the first set of transistors to the supply voltage in an active receive configuration, the active receive configuration based on the active mode of the phase shifter; and
the third switch is configured to connect the third channel terminal of the third set of transistors to the ground in the active receive configuration.

16. The apparatus of claim 15, wherein:
the third set of transistors is configured to:
  accept an input voltage at the third port in the active receive configuration, the input voltage associated with a split receive signal; and
  generate a current based on the input voltage in the active receive configuration; and
the first set of transistors is configured to generate, based on at least a portion of the current, an output voltage at the first port, the output voltage associated with an amplified split receive signal.

17. The apparatus of claim 16, wherein:
the second set of transistors is configured to allocate an amount of the current that flows through the first set of transistors in the active receive configuration.

18. The apparatus of claim 10, wherein:
the second branch circuit comprises a second switch, the second switch configured to selectively:
  connect the second channel terminal of the second set of transistors to the supply voltage; and
  connect the second channel terminal of the second set of transistors to the ground.

19. The apparatus of claim 18, wherein:
the second switch is configured to connect the second channel terminal of the second set of transistors to the supply voltage in an active transmit configuration and an active receive configuration.

20. The apparatus of claim 18, wherein:
the phase shifter is configured to selectively operate in the active mode and a passive mode;
the first switch is configured to connect the first channel terminal of the first set of transistors to the ground in a passive configuration, the passive configuration based on the passive mode of the phase shifter;
the second switch is configured to connect the second channel terminal of the second set of transistors to the ground in the passive configuration; and
the third switch is configured to connect the third channel terminal of the third set of transistors to the ground in the passive configuration.

21. The apparatus of claim 20, wherein:
the passive mode comprises a passive transmit mode and a passive receive mode;
the first set of transistors is configured to operate as a first series resistor in both the passive transmit mode and the passive receive mode;
the second set of transistors is configured to selectively:
  operate as a second series resistor in the passive transmit mode; and
  operate as a shunt resistor in the passive receive mode; and
the third set of transistors is configured to selectively:
  operate as the shunt resistor in the passive transmit mode; and
  operate as the second series resistor in the passive receive mode.

22. The apparatus of claim 1, wherein the wireless transceiver comprises a time-division duplex wireless transceiver.

23. An apparatus comprising:
an antenna element of an antenna array configured to:
  transmit a phase-shifted transmit signal; and
  receive an input receive signal; and
a wireless transceiver comprising:
  a transmit path coupled to the antenna element;
  a receive path coupled to the antenna element; and
  a phase shifter disposed in both the transmit path and the receive path, the phase shifter configured to operate in an active mode to:
    generate the phase-shifted transmit signal based on an input transmit signal accepted at a shared node of the phase shifter; and
    generate a phase-shifted receive signal at the shared node based on the input receive signal,
    the phase shifter comprising vector modulation means for adjusting amplitudes of two split transmit signals that are associated with the input transmit signal and adjusting amplitudes of two split receive signals that are associated with the input receive signal.

24. The apparatus of claim 23, wherein:
the phase shifter comprises a quadrature coupling circuit, the quadrature coupling circuit comprising a first quadrature port and a second quadrature port;
the vector modulation means is coupled to the first quadrature port and the second quadrature port;
the two split transmit signals comprise quadrature signals having phases that differ by approximately ninety degrees from each other; and
the two split receive signals comprise in-phase signals having other phases that are approximately equal to each other.

25. The apparatus of claim 23, wherein the vector modulation means comprises:
first bidirectional amplification means for amplifying a first split transmit signal of the two split transmit signals and amplifying a first split receive signal of the two split receive signals; and
second bidirectional amplification means for amplifying a second split transmit signal of the two split transmit signals and amplifying a second split receive signal of the two split receive signals.

26. The apparatus of claim 25, wherein:
the first bidirectional amplification means comprises:
a first port disposed in both the transmit path and the receive path, the first port configured to accept the first split transmit signal;
a second port disposed in the transmit path;
a third port disposed in the receive path, the third port configured to accept the first split receive signal; and
first duplexing means for selectively providing, based on the first split transmit signal, a first amplified split transmit signal at the second port and providing, based on the first split receive signal, a first amplified split receive signal at the first port, the first duplexing means coupled to the first port, the second port, and the third port; and
the second bidirectional amplification means comprises:
another first port disposed in both the transmit path and the receive path,
the other first port configured to accept the second split transmit signal;
another second port disposed in the transmit path;
another third port disposed in the receive path, the other third port configured to accept the second split receive signal; and
second duplexing means for selectively providing, based on the second split transmit signal, a second amplified split transmit signal at the other second port and providing, based on the second split receive signal, a second amplified split receive signal at the other first port, the second duplexing means coupled to the other first port, the other second port, and the other third port.

27. The apparatus of claim 26, wherein:
the first duplexing means comprises:
first input means for respectively generating a first current based on a first input voltage, the first input voltages selectively associated with the first split transmit signal and the first split receive signal; and
first output means for respectively generating a first output voltage based on at least a portion of the first current, the first output voltage selectively associated with the first amplified split transmit signal and the first amplified split receive signal; and
the second duplexing means comprises:
second input means for respectively generating a second current based on a second input voltage, the second input voltages selectively associated with the second split transmit signal and the second split receive signal; and
second output means for respectively generating a second output voltage based on at least a portion of the second current, the second output voltage selectively associated with the second amplified split transmit signal and the second amplified split receive signal.

28. The apparatus of claim 27, wherein:
the first duplexing means comprises first current-steering means for allocating an amount of the first current that flows through the first output means; and
the second duplexing means comprises second current-steering means for allocating an amount of the second current that flows through the second output means.

29. The apparatus of claim 28, wherein:
the first duplexing means comprises first switching means for connecting the first input means to a ground and connecting the first output means and the first current-steering means to a supply voltage; and
the second duplexing means comprises second switching means for connecting the second input means to the ground and connecting the second output means and the second current-steering means to the supply voltage.

30. A method comprising:
operating a phase shifter in an active mode during a first time interval and a second time interval;
accepting an input transmit signal at a shared node of the phase shifter during the first time interval;
generating, using a first bidirectional variable gain amplifier of the phase shifter and a second bidirectional variable gain amplifier of the phase shifter, a phase-shifted transmit signal at a transmit node of the phase shifter during the first time interval, the phase-shifted transmit signal based on the input transmit signal;
accepting an input receive signal at a receive node of the phase shifter during the second time interval; and
generating, using the first bidirectional variable gain amplifier and the second bidirectional variable gain amplifier, a phase shifted receive signal at the shared node during the second time interval, the phase-shifted receive signal based on the input receive signal.

31. The method of claim 30, wherein:
the generating of the phase-shifted transmit signal comprises:
amplifying, using the first bidirectional variable gain amplifier, a first split transmit signal associated with the input transmit signal to generate a first amplified split transmit signal;
amplifying, using the second bidirectional variable gain amplifier, a second split transmit signal associated with the input transmit signal to generate a second amplified split transmit signal; and
combining the first amplified split transmit signal and the second amplified split transmit signal to generate the phase-shifted transmit signal, the phase-shifted transmit signal having a first phase that differs from a second phase of the input transmit signal; and
the generating of the phase-shifted receive signal comprises:
amplifying, using the first bidirectional variable gain amplifier, a first split receive signal associated with the input receive signal to generate a first amplified split receive signal;
amplifying, using the second bidirectional variable gain amplifier, a second split receive signal associated with the input receive signal to generate a second amplified split receive signal; and
combining the first amplified receive transmit signal and the second amplified split receive signal to generate the phase-shifted receive signal, the phase-shifted receive signal having a third phase that differs from a fourth phase of the input receive signal.

32. The method of claim 31, wherein:
the amplifying of the first split transmit signal comprises:
  accepting, via a first branch circuit of the first bidirectional variable gain amplifier, a first input voltage based on the first split transmit signal;
  generating, via the first branch circuit, a first current based on the first input voltage;
  generating, via a second branch circuit of the first bidirectional variable gain amplifier, a first output voltage based on at least a portion of the first current; and
  allocating, via a third branch circuit of the first bidirectional variable gain amplifier, an amount of the first current that flows through the second branch circuit; and
the amplifying of the second split transmit signal comprises:
  accepting, via another first branch circuit of the second bidirectional variable gain amplifier, a second input voltage based on the second split transmit signal;
  generating, via the other first branch circuit, a second current based on the second input voltage;
  generating, via another second branch circuit of the second bidirectional variable gain amplifier, a second output voltage based on at least a portion of the second current; and
  allocating, via another third branch circuit of the second bidirectional variable gain amplifier, an amount of the second current that flows through the second branch circuit.

33. The method of claim 32, wherein:
the amplifying of the first split receive signal comprises:
  accepting, via the third branch circuit of the first bidirectional variable gain amplifier, a third input voltage based on the first split receive signal;
  generating, via the third branch circuit of the first bidirectional variable gain amplifier, a third current based on the third input voltage;
  generating, via the first branch circuit of the first bidirectional variable gain amplifier, a third output voltage based on at least a portion of the third current; and
  allocating, via the second branch circuit of the first bidirectional variable gain amplifier, an amount of the second current that flows through the first branch circuit; and
the amplifying of the second split receive signal comprises:
  accepting, via the other third branch circuit of the second bidirectional variable gain amplifier, a fourth input voltage based on the second split receive signal;
  generating, via the other third branch circuit of the second bidirectional variable gain amplifier, a fourth current based on the fourth input voltage;
  generating, via the other first branch circuit of the second bidirectional variable gain amplifier, a fourth output voltage based on at least a portion of the fourth current; and
  allocating, via the second branch circuit of the second bidirectional variable gain amplifier, an amount of the fourth current that flows through the other first branch circuit.

34. An apparatus comprising:
at least one bidirectional variable gain amplifier comprising:
  two or more ports, the two or more ports comprising a first port and a third port, the first port configured to selectively be an input and an output of the at least one bidirectional variable gain amplifier; and
  a T-network coupled between the two or more ports, the T-network comprising:
    a common node;
    a first branch circuit coupled between the first port and the common node, the first branch circuit comprising a first set of transistors;
    a second branch circuit coupled to a supply voltage and the common node, the second branch circuit comprising a second set of transistors; and
    a third branch circuit coupled between the third port and the common node, the third branch circuit comprising a third set of transistors.

35. The apparatus of claim 34, wherein:
the first set of transistors comprises:
  a first common-gate amplifier; or
  multiple first common-gate amplifiers coupled together in parallel;
the second set of transistors comprises:
  a second common-gate amplifier; or
  multiple second common-gate amplifiers coupled together in parallel; and
the third set of transistors comprises:
  a third common-gate amplifier; or
  multiple third common-gate amplifiers coupled together in parallel.

36. The apparatus of claim 34, wherein:
the first branch circuit comprises a first switch configured to selectively:
  connect a first channel terminal of the first set of transistors to the supply voltage in an active receive configuration; and
  connect the first channel terminal of the first set of transistors to a ground in an active transmit configuration; and
the third branch circuit comprises a third switch configured to selectively:
  connect a third channel terminal of the third set of transistors to the supply voltage in the active transmit configuration; and
  connect the third channel terminal of the third set of transistors to the ground in the active receive configuration.

37. The apparatus of claim 36, wherein:
the second branch circuit comprises a second switch configured to selectively:
  connect a second channel terminal of the second set of transistors to the supply voltage in both the active transmit configuration and the active receive configuration; and
  connect the second channel terminal of the second set of transistors to the ground in a passive configuration;
the first branch circuit is configured to connect the first channel terminal of the first set of transistors to the ground in the passive configuration; and
the third branch circuit is configured to connect the third channel terminal of the third set of transistors to the ground in the passive configuration.

38. The apparatus of claim 37, wherein:
the at least one bidirectional variable gain amplifier is configured to selectively:
  amplify a first signal that propagates from the first port to the third port in the active transmit configuration;

amplify a second signal that propagates from the third port to the first port in the active receive configuration;

attenuate a third signal that propagates from the first port to the third port in the passive configuration; and attenuate a fourth signal that propagates from the third port to the first port in the passive configuration.

39. The apparatus of claim 34, wherein:

the two or more ports comprise the first port, a second port, and the third port;

the second branch circuit is coupled between the common node and the second port; and the at least one bidirectional variable gain amplifier is configured to selectively:

propagate a first signal from the first port to the second port; and propagate a second signal from the third port to the first port.

40. The apparatus of claim 39, further comprising a wireless transceiver comprising:

a transmit path;

a receive path; and the at least one bidirectional variable gain amplifier, the at least one bidirectional variable gain amplifier disposed in both the transmit path and the receive path, the first port disposed in both the transmit path and the receive path, the second port disposed in the transmit path, and the third port disposed in the receive path.

41. The apparatus of claim 40, wherein:

the at least one bidirectional variable gain amplifier comprises a first bidirectional variable gain amplifier and a second bidirectional variable gain amplifier; and the wireless transceiver comprises a phase shifter disposed in both the transmit path and the receive path, the phase shifter comprising the first bidirectional variable gain amplifier and the second bidirectional variable gain amplifier.

42. The apparatus of claim 34, further comprising:

an antenna array comprising multiple antenna elements, the at least one bidirectional variable gain amplifier coupled to at least one antenna element of the multiple antenna elements; and a wireless transceiver coupled to the antenna array, the wireless transceiver comprising the at least one bidirectional variable gain amplifier and configured to process signals communicated via the antenna array.

43. The apparatus of claim 42, further comprising:

a display screen; and a processor operably coupled to the display screen and the wireless transceiver, the processor configured to present one or more graphical images on the display screen based on the signals communicated by the wireless transceiver using the at least one bidirectional variable gain amplifier.

44. A method comprising:

operating a bidirectional variable gain amplifier in an active transmit configuration during a first time interval, the bidirectional variable gain amplifier comprising a first port and a third port;

amplifying a first signal that propagates from the first port to the third port in the active transmit configuration;

operating the bidirectional variable gain amplifier in an active receive configuration during a second time interval; and amplifying a second signal that propagates from the third port to the first port in the active receive configuration.

45. The method of claim 44, wherein:

the amplifying of the first signal comprises amplifying the first signal by a first factor that is greater than one; and the amplifying of the second signal comprises amplifying the second signal by a second factor that is greater than one.

46. The method of claim 44, further comprising:

operating the bidirectional variable gain amplifier in a passive configuration during a third time interval;

attenuating a third signal that propagates from the first port to the third port in the passive configuration; and attenuating a fourth signal that propagates from the third port to the first port in the passive configuration.

47. The method of claim 44, wherein:

the bidirectional variable gain amplifier comprises a first set of transistors coupled between the first port and a common node, a second set of transistors coupled to the common node, and a third set of transistors coupled between the third port and the common node;

the operating of the bidirectional variable gain amplifier in the active transmit configuration comprises:

operating the first set of transistors as a first set of input transistors;

operating the second set of transistors as a set of current-steering transistors; and operating the third set of transistors as a second set of output transistors; and the operating of the bidirectional variable gain amplifier in the active receive configuration comprises:

operating the first set of transistors as a first set of output transistors;

operating the second set of transistors as the set of current-steering transistors; and operating the third set of transistors as a second set of input transistors.

48. The method of claim 44, wherein:

the bidirectional variable gain amplifier comprises a second port, the method further comprising:

operating the bidirectional variable gain amplifier in the active transmit configuration during a third time interval;

propagating a third signal from the first port to the second port during the third time interval; and amplifying the third signal in the active transmit configuration.

49. The method of claim 48, wherein:

the bidirectional variable gain amplifier comprises a first set of transistors coupled between the first port and a common node, a second set of transistors coupled to the common node, and a third set of transistors coupled between the third port and the common node; and the operating of the bidirectional variable gain amplifier in the active transmit configuration during the third time interval comprises:

operating the first set of transistors as a set of input transistors;

operating the second set of transistors as a set of output transistors; and operating the third set of transistors as a set of current-steering transistors.

* * * * *